(12) United States Patent
Sumi et al.

(10) Patent No.: US 12,165,708 B2
(45) Date of Patent: Dec. 10, 2024

(54) SEMICONDUCTOR MEMORY DEVICE AND METHOD OF CONTROLLING THE SAME

(71) Applicant: KIOXIA CORPORATION, Tokyo (JP)

(72) Inventors: Reiko Sumi, Yokohama (JP); Kazutaka Ikegami, Inagi (JP)

(73) Assignee: KIOXIA CORPORATION, Tokyo (JP)

( * ) Notice: Subject to any disclaimer, the term of this patent is extended or adjusted under 35 U.S.C. 154(b) by 185 days.

(21) Appl. No.: 18/068,605

(22) Filed: Dec. 20, 2022

(65) Prior Publication Data

US 2023/0410913 A1     Dec. 21, 2023

(30) Foreign Application Priority Data

Jun. 17, 2022  (JP) ................. 2022-098481

(51) Int. Cl.
| | | |
|---|---|---|
| *G11C 16/10* | (2006.01) | |
| *G11C 16/16* | (2006.01) | |
| *G11C 16/34* | (2006.01) | |

(52) U.S. Cl.
CPC ............. *G11C 16/10* (2013.01); *G11C 16/16* (2013.01); *G11C 16/3445* (2013.01); *G11C 16/3459* (2013.01)

(58) Field of Classification Search
CPC ..... G11C 16/10; G11C 16/16; G11C 16/3445; G11C 16/3459; G11C 16/32; G11C 16/08; G11C 16/0483; H10B 41/27; H10B 43/27

See application file for complete search history.

(56) References Cited

U.S. PATENT DOCUMENTS

| | | | |
|---|---|---|---|
| 9,397,110 B2 | 7/2016 | Lue | |
| 10,236,254 B1 | 3/2019 | Arai et al. | |
| 11,139,037 B2 | 10/2021 | Maeda | |
| 2010/0207194 A1* | 8/2010 | Tanaka | .................. H10B 43/20 |
| | | | 438/588 |
| 2020/0091169 A1 | 3/2020 | Tokutomi et al. | |

FOREIGN PATENT DOCUMENTS

| | | |
|---|---|---|
| JP | 2019-54182 A | 4/2019 |
| JP | 2020-198141 A | 12/2020 |

\* cited by examiner

*Primary Examiner* — Xiaochun L Chen
(74) *Attorney, Agent, or Firm* — Oblon, McClelland, Maier & Neustadt, L.L.P.

(57) ABSTRACT

A semiconductor memory device comprises: a semiconductor layer extending in a first direction; a first and second conductive layer facing the semiconductor layer from one side and the other side in a second direction; and a charge storage layer comprising portions provided between the semiconductor layer and first conductive layer and between the semiconductor layer and second conductive layer. The semiconductor memory device is configured to execute erase operation, first write operation, and second write operation. In the first write operation, the first and second conductive layers are applied with first program voltage. In the second write operation, the first conductive layer is applied with second program voltage, and second conductive layer is applied with second voltage lower than the second program voltage. The second write operation is executed after execution of the erase operation and before execution of the first write operation.

22 Claims, 32 Drawing Sheets

SEMICONDUCTOR MEMORY DEVICE AND METHOD OF CONTROLLING THE SAME

CROSS-REFERENCE TO RELATED APPLICATIONS

This application is based upon and claims the benefit of Japanese Patent Application No. 2022-098481, filed on Jun. 17, 2022, the entire contents of which are incorporated herein by reference.

BACKGROUND

Field

Embodiments described below relate to a semiconductor memory device and a method of controlling the same.

Description of the Related Art

There is known a semiconductor memory device comprising: a semiconductor substrate; a plurality of conductive layers arranged in a direction intersecting a surface of this semiconductor substrate; a semiconductor layer facing these plurality of conductive layers; and a gate insulating layer provided between the conductive layers and the semiconductor layer. The gate insulating layer comprises a memory portion configured to store data, and the memory portion is, for example, an insulating charge storage layer of the likes of silicon nitride ($Si_3N_4$) and a conductive charge storage layer of the likes of a floating gate.

DETAILED DESCRIPTION

Figure 1:
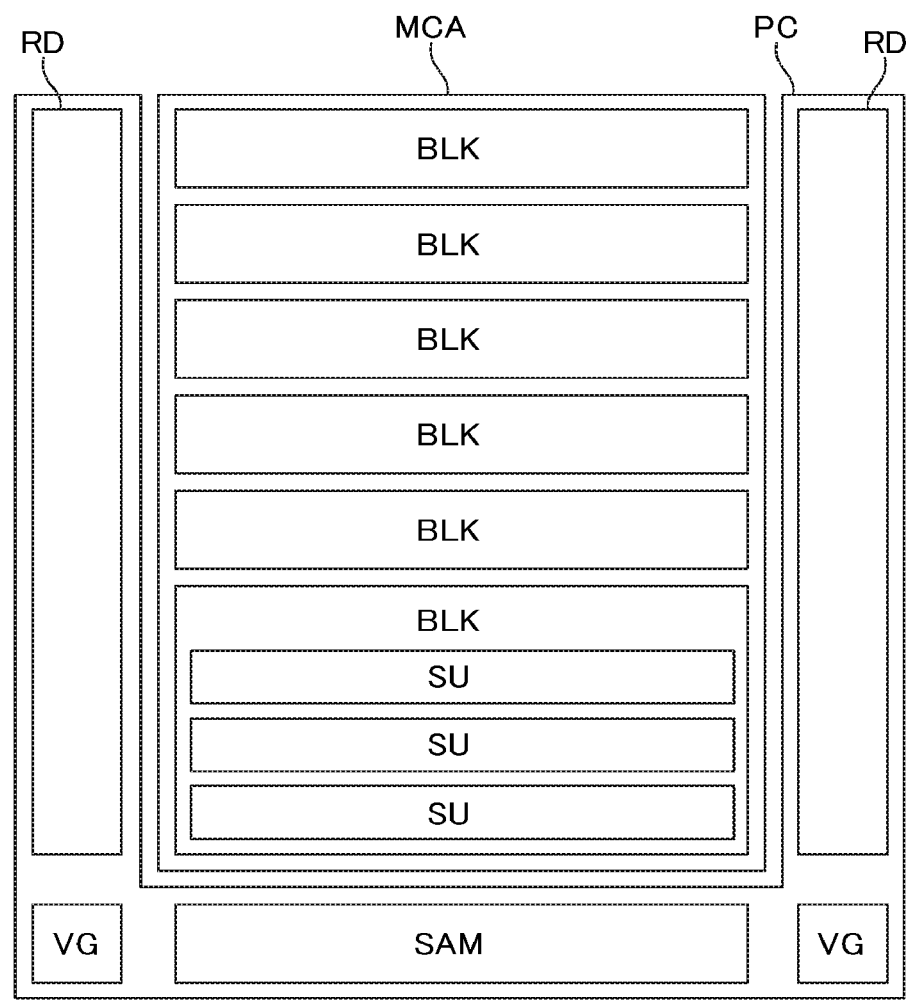
FIG. 1 is a schematic block diagram showing a part of a configuration of a semiconductor memory device according to a first embodiment.

A semiconductor memory device according to an embodiment comprises: a semiconductor layer that extends in a first direction; a first conductive layer and a second conductive layer that are arranged in a second direction intersecting the first direction, and that face the semiconductor layer from one side and the other side in the second direction; a charge storage layer that comprises a first portion provided between the semiconductor layer and the first conductive layer and a second portion provided between the semiconductor layer and the second conductive layer; a bit line electrically connected to the semiconductor layer; and a source line electrically connected to the semiconductor layer. Moreover, this semiconductor memory device is configured to execute an erase operation, a first write operation, and a second write operation. In the erase operation, an erase voltage is applied to at least one of the bit line and source line, and a first voltage which is lower than the erase voltage is applied to the first conductive layer and the second conductive layer. In the first write operation, a first program voltage which is higher than the first voltage is applied to the first conductive layer and the second conductive layer. In the second write operation, a second program voltage which is higher than the first voltage is applied to the first conductive layer, and a second voltage which is higher than the first voltage and lower than the second program voltage is applied to the second conductive layer. The first write operation is executed after execution of the erase operation. The second write operation is executed after execution of the erase operation and before execution of the first write operation.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, a part of a configuration, and so on, thereof will sometimes be omitted. Moreover, portions that are common to a plurality of embodiments will be assigned with the same symbols, and descriptions thereof sometimes omitted.

Moreover, when a "semiconductor memory device" is referred to in the present specification, it will sometimes mean a memory die, and will sometimes mean a memory system including a control die, of the likes of a memory chip, a memory card, or a Solid State Drive (SSD). Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, in the case of three transistors having been serially connected, the first transistor is still "electrically connected" to the third transistor even if the second transistor is in an OFF state.

Moreover, in the present specification, when a first configuration is said to be "connected between" a second configuration and a third configuration, it will sometimes mean that the first configuration, the second configuration, and the third configuration are serially connected, and the second configuration is connected to the third configuration via the first configuration.

Moreover, in the present specification, when a circuit, or the like, is said to "make electrically continuous" two wirings, or the like, this will sometimes mean, for example, that this circuit, or the like, includes a transistor, or the like, that this transistor, or the like, is provided in a current path between the two wirings, and that this transistor, or the like, is in an ON state.

Moreover, in the present specification, a certain direction parallel to an upper surface of a substrate will be referred to as an X direction, a direction parallel to the upper surface of the substrate and perpendicular to the X direction will be referred to as a Y direction, and a direction perpendicular to the upper surface of the substrate will be referred to as a Z direction.

Moreover, in the present specification, sometimes, a direction lying along a certain plane will be referred to as a first direction, a direction intersecting the first direction along this certain plane will be referred to as a second direction, and a direction intersecting this certain plane will be referred to as a third direction. These first direction, second direction, and third direction may correspond to any of the X direction, the Y direction, and the Z direction, but need not do so.

Moreover, in the present specification, expressions such as "above" or "below" will be defined with reference to the substrate. For example, an orientation of moving away from the substrate along the above-described Z direction will be referred to as above, and an orientation of coming closer to the substrate along the Z direction will be referred to as below. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration. Moreover, a surface intersecting the X direction or the Y direction will be referred to as a side surface, and so on.

First Embodiment

[Circuit Configuration]

Figure 2:
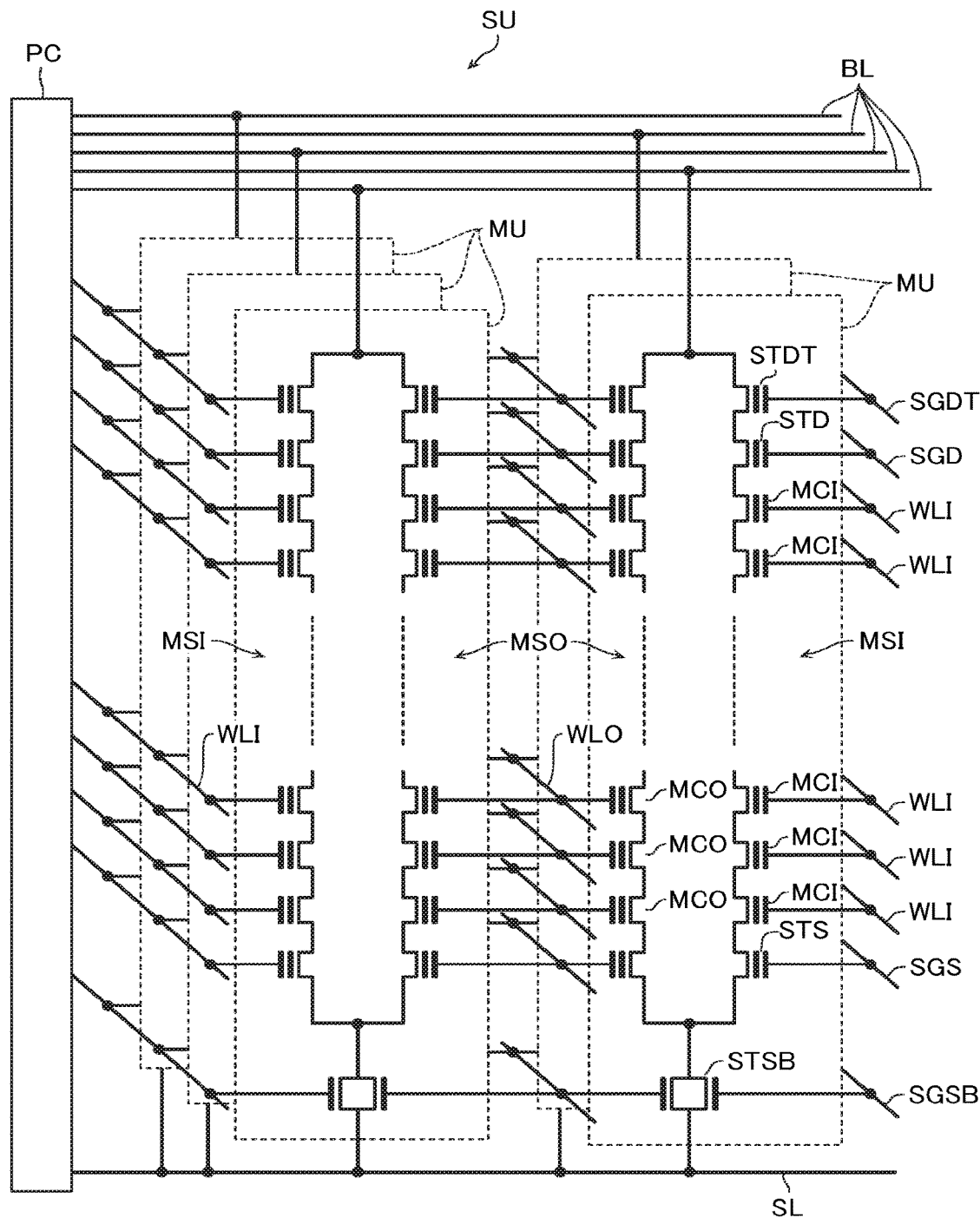
FIG. 2 is a schematic equivalent circuit diagram showing a part of the configuration of the semiconductor memory device.
Figure 3:
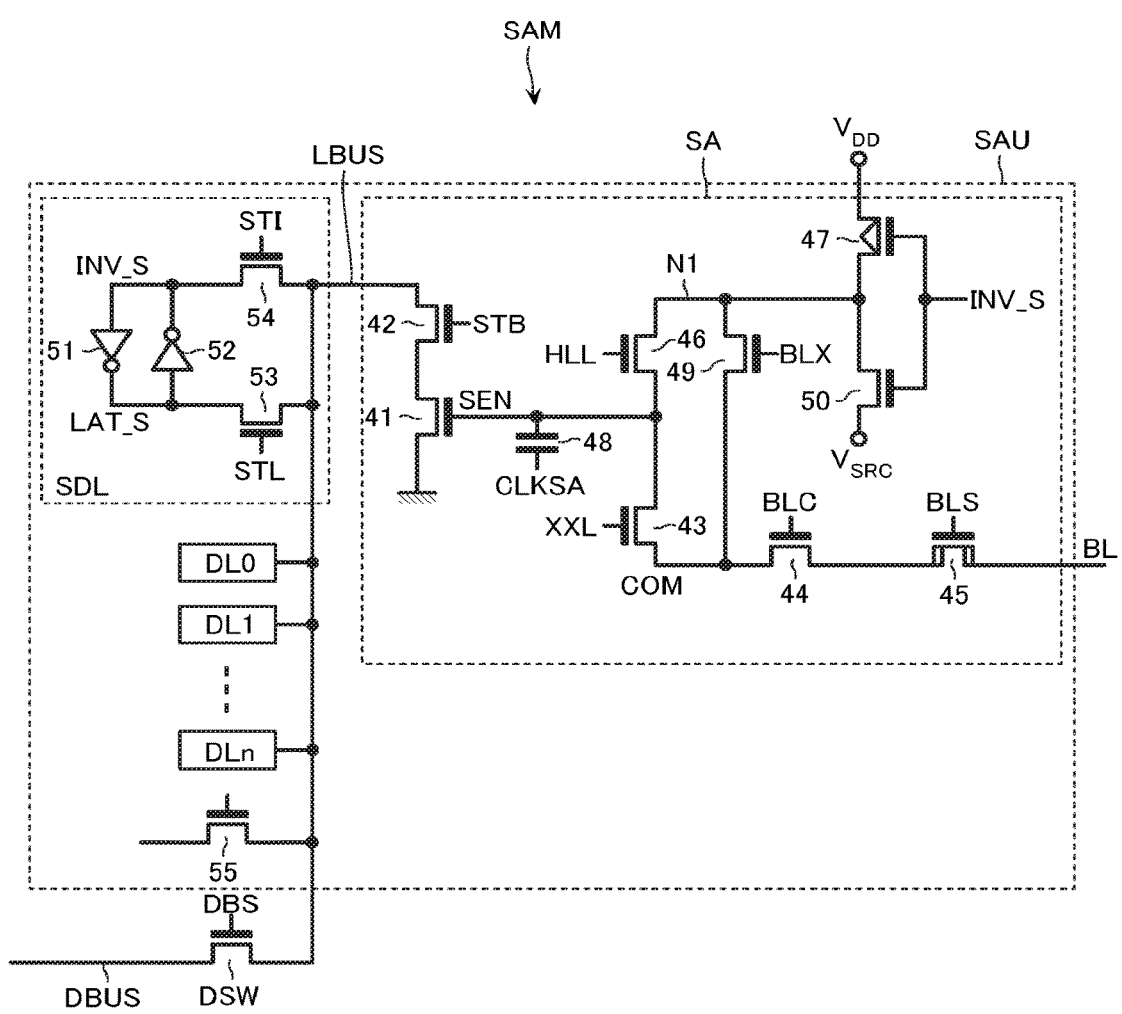
FIG. 3 is a schematic equivalent circuit diagram showing a part of the configuration of the semiconductor memory device.
Figure 4:
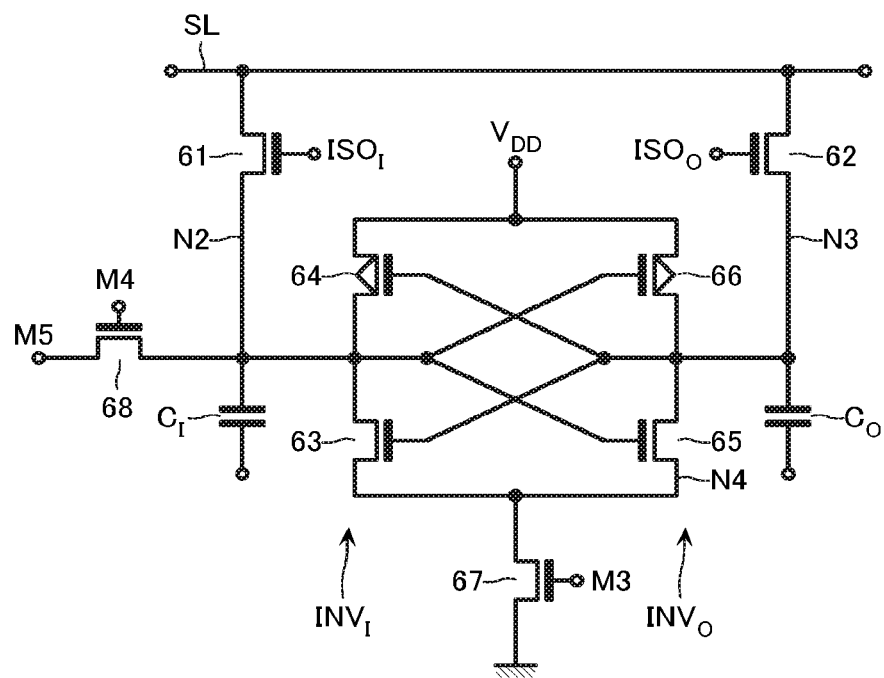
FIG. 4 is a schematic equivalent circuit diagram showing a part of the configuration of the semiconductor memory device.

FIG. 1 is a schematic block diagram showing a part of configuration of a semiconductor memory device according to a first embodiment. FIGS. 2 to 4 are each a schematic equivalent circuit diagram showing a part of the configuration of the semiconductor memory device.

As shown in FIG. 1, the semiconductor memory device according to the present embodiment comprises: a memory cell array MCA; and a peripheral circuit PC that controls the memory cell array MCA.

[Circuit Configuration of Memory Cell Array MCA]

The memory cell array MCA comprises a plurality of memory blocks BLK. The memory block BLK comprises a plurality of string units SU. As shown in FIG. 2, for example, the string unit SU comprises a plurality of memory units MU. These plurality of memory units MU each comprise two memory strings MSI, MSO. One ends of these memory strings MSI, MSO are respectively connected to drain side select transistors STD, STDT, and, via these drain side select transistors STD, STDT, are connected to a common bit line BL. The other ends of the memory strings MSI, MSO are connected to common source side select transistors STS, STSB, and, via these source side select transistors STS, STSB, are connected to a common source line SL.

The memory string MSI comprises a serially-connected plurality of memory cells MCI. The memory string MSO comprises a serially-connected plurality of memory cells MCO. The memory cells MCI, MCO are each a field effect type transistor comprising a semiconductor layer, a gate insulating layer, and a gate electrode. The semiconductor layer functions as a channel region. The gate insulating layer comprises a charge storage layer configured to store data. Threshold voltages of the memory cells MCI, MCO change according to an amount of charge in the charge storage layer. The gate electrodes of the plurality of memory cells MCI are respectively connected to a plurality of word lines WLI. Moreover, the gate electrodes of the plurality of memory cells MCO are respectively connected to a plurality of word lines WLO. The word lines WLI, WLO are each connected to all of the memory units MU in the memory block BLK.

The select transistors (STD, STDT, STS, STSB) are field effect type transistors each comprising a semiconductor layer, a gate insulating layer, and a gate electrode. The semiconductor layer functions as a channel region. The gate electrode of the drain side select transistor STDT is connected to a drain side select gate line SGDT. The drain side select gate line SGDT is connected to all of the memory units MU in the memory block BLK. The gate electrode of the drain side select transistor STD is connected to a drain side select gate line SGD. The drain side select gate line SGD is connected to all of the memory units MU in the string unit SU. The gate electrodes of the source side select transistors STS, STSB are respectively connected to source side select gate lines SGS, SGSB. The source side select gate lines SGS, SGSB are each connected to all of the memory units MU in the memory block BLK.

Note that in the description below, the memory string MSI will sometimes be referred to as a front-side memory string MSI, or the like, and the memory string MSO will sometimes be referred to as a reverse-side memory string MSO, or the like. Moreover, the memory cell MCI will sometimes be referred to as a front-side memory cell MCI, or the like, and the memory cell MCO will sometimes be referred to as a reverse-side memory cell MCO, or the like.

[Circuit Configuration of Peripheral Circuit PC]

As shown in FIG. 1, for example, the peripheral circuit PC comprises: a row decoder RD which is connected to the memory cell array MCA; a sense amplifier module SAM which is connected to the memory cell array MCA; and a voltage generating circuit VG which is connected to the row decoder RD and the sense amplifier module SAM. In addition, the peripheral circuit PC comprises a sequencer, address register, status register, and so on, that are unillustrated. Moreover, the peripheral circuit PC comprises a current comparing circuit (FIG. 4) which is connected to the source line SL.

[Circuit Configuration of Row Decoder RD]

The row decoder RD (FIG. 1) transfers an operation voltage to the word lines WLI, WLO and select gate lines (SGD, SGDT, SGS, SGSB), according to a row address in an unillustrated address register, for example. The row address includes information designating the memory cell array MCA, memory block BLK, string unit SU, and word lines WLI, WLO, for example.

[Circuit Configuration of Sense Amplifier Module SAM]

As shown in FIG. 3, for example, the sense amplifier module SAM comprises a sense amplifier unit SAU. A plurality of the sense amplifier units SAU are provided correspondingly to a plurality of the bit lines BL. The sense amplifier units SAU each comprise a sense amplifier SA, a wiring LBUS, and latch circuits SDL, DL0-DLn (where n is a natural number). The wiring LBUS is connected with a pre-charge-dedicated charge transistor 55. The wiring LBUS is connected to a wiring DBUS via a switch transistor DSW.

The sense amplifier SA comprises a sense transistor 41. The sense transistor 41 discharges a charge of the wiring LBUS depending on a current flowing in the bit line BL. A source electrode of the sense transistor 41 is connected to a voltage supply line applied with a ground voltage $V_{SS}$. A drain electrode of the sense transistor 41 is connected to the wiring LBUS via a switch transistor 42. A gate electrode of the sense transistor 41 is connected to the bit line BL via a sense node SEN, a discharge transistor 43, a node COM, a clamp transistor 44, and a voltage-withstanding transistor 45. Note that the sense node SEN is connected to an internal control signal line CLKSA via a capacitor 48.

In addition, the sense amplifier SA comprises a voltage transfer circuit. The voltage transfer circuit selectively causes the node COM and sense node SEN to be electrically continuous with a voltage supply line applied with a voltage $V_{DD}$ or voltage supply line applied with a voltage $V_{SRC}$, depending on data latched in the latch circuit SDL. The voltage transfer circuit comprises a node N1, a charge transistor 46, a charge transistor 49, a charge transistor 47, and a discharge transistor 50. The charge transistor 46 is connected between the node N1 and the sense node SEN. The charge transistor 49 is connected between the node N1 and the node COM. The charge transistor 47 is connected between the node N1 and a voltage supply line applied with the voltage $V_{DD}$. The discharge transistor 50 is connected between the node N1 and a voltage supply line applied with the voltage $V_{SRC}$. Note that gate electrodes of the charge transistor 47 and discharge transistor 50 are commonly connected to a node INV_S of the latch circuit SDL.

Note that the sense transistor 41, the switch transistor 42, the discharge transistor 43, the clamp transistor 44, the charge transistor 46, the charge transistor 49, and the discharge transistor 50 are enhancement type NMOS transistors, for example. The voltage-withstanding transistor 45 is a depression type NMOS transistor, for example. The charge transistor 47 is a PMOS transistor, for example.

Moreover, a gate electrode of the switch transistor 42 is connected to a signal line STB. A gate electrode of the discharge transistor 43 is connected to a signal line XXL. A gate electrode of the clamp transistor 44 is connected to a signal line BLC. A gate electrode of the voltage-withstanding transistor 45 is connected to a signal line BLS. A gate electrode of the charge transistor 46 is connected to a signal line HLL. A gate electrode of the charge transistor 49 is connected to a signal line BLX. These signal lines STB, XXL, BLC, BLS, HLL, BLX are connected to an unillustrated sequencer.

The latch circuit SDL comprises a node LAT_S, the node INV_S, an inverter 51, an inverter 52, a switch transistor 53, and a switch transistor 54. The inverter 51 comprises an output terminal connected to the node LAT_S and an input terminal connected to the node INV_S. The inverter 52 comprises an input terminal connected to the node LAT_S and an output terminal connected to the node INV_S. The switch transistor 53 is provided in a current path between the node LAT_S and the wiring LBUS. The switch transistor 54 is provided in a current path between the node INV_S and the wiring LBUS. The switch transistors 53, 54 are NMOS transistors, for example. A gate electrode of the switch transistor 53 is connected to an unillustrated sequencer via a signal line STL. A gate electrode of the switch transistor 54 is connected to an unillustrated sequencer via a signal line STI.

The latch circuits DL0-DLn are configured substantially similarly to the latch circuit SDL. However, as mentioned above, the node INV_S of the latch circuit SDL is electrically continuous with the gate electrodes of the charge transistor 47 and discharge transistor 50 in the sense amplifier SA. The latch circuits DL0-DLn differ from the latch circuit SDL in this respect.

The switch transistor DSW is an NMOS transistor, for example. The switch transistor DSW is connected between the wiring LBUS and the wiring DBUS. A gate electrode of the switch transistor DSW is connected to an unillustrated sequencer via a signal line DBS.

[Circuit Configuration of Current Comparing Circuit]

As shown in FIG. 4, the current comparing circuit comprises: a node N2 connected to the source line SL via a switch transistor 61; a node N3 connected to the source line SL via a switch transistor 62; capacitors $C_T$, $C_O$ respectively connected to the nodes N2, N3; and inverters $INV_I$, $INV_O$ connected to the nodes N2, N3.

The switch transistors 61, 62 are enhancement type NMOS transistors, for example. Gate electrodes of the switch transistors 61, 62 are respectively connected to signal lines $ISO_I$, $ISO_O$.

An output terminal and input terminal of the inverter $INV_I$ are respectively connected to the nodes N2, N3. The inverter $INV_I$ comprises transistors 63, 64. The transistor 63 is an enhancement type NMOS transistor, for example. The transistor 64 is a PMOS transistor, for example. A source electrode of the transistor 63 is connected to a node N4. A source electrode of the transistor 64 is connected to a voltage supply line applied with the voltage $V_{DD}$. Drain electrodes of the transistors 63, 64 are connected to the node N2. Gate electrodes of the transistors 63, 64 are connected to the node N3.

An output terminal and input terminal of the inverter $INV_O$ are respectively connected to the nodes N3, N2. The inverter $INV_O$ comprises transistors 65, 66. The transistor 65 is an enhancement type NMOS transistor, for example. The transistor 66 is a PMOS transistor, for example. A source electrode of the transistor 65 is connected to the node N4. A source electrode of the transistor 66 is connected to a voltage supply line applied with the voltage $V_{DD}$. Drain electrodes of the transistors 65, 66 are connected to the node N3. Gate electrodes of the transistors 65, 66 are connected to the node N2.

The node N4 is connected to a voltage supply line applied with the ground voltage $V_{SS}$, via a switch transistor 67. The switch transistor 67 is an enhancement type NMOS transistor, for example. A gate electrode of the switch transistor 67 is connected to a signal line M3.

Note that the node N2 is connected to a signal line M5 via a switch transistor 68. The switch transistor 68 is an enhancement type NMOS transistor, for example. A gate electrode of the switch transistor 68 is connected to a signal line M4.

[Structure]

Figure 5:
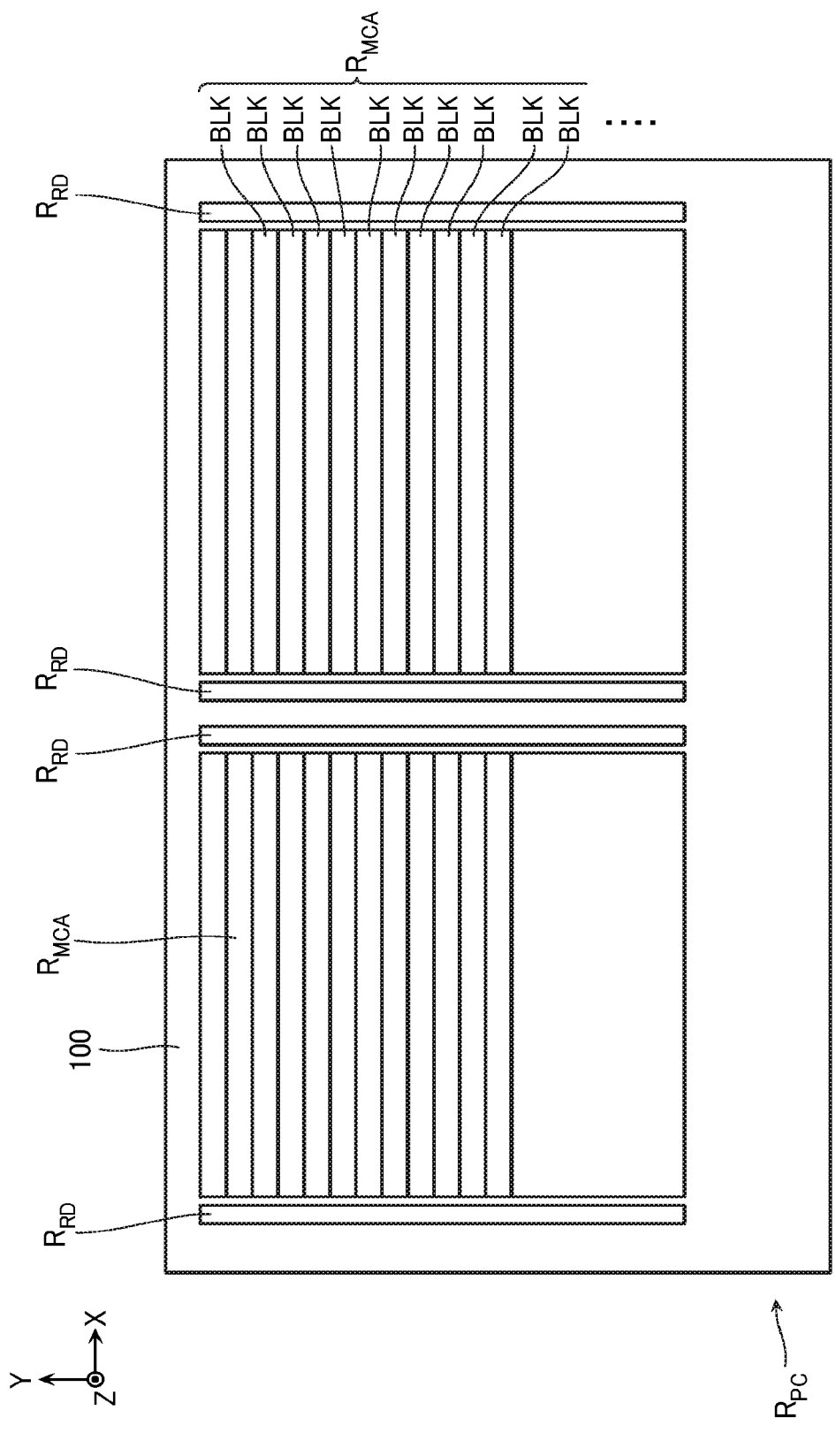
FIG. 5 is a schematic plan view showing a part of the configuration of the semiconductor memory device.
Figure 6:
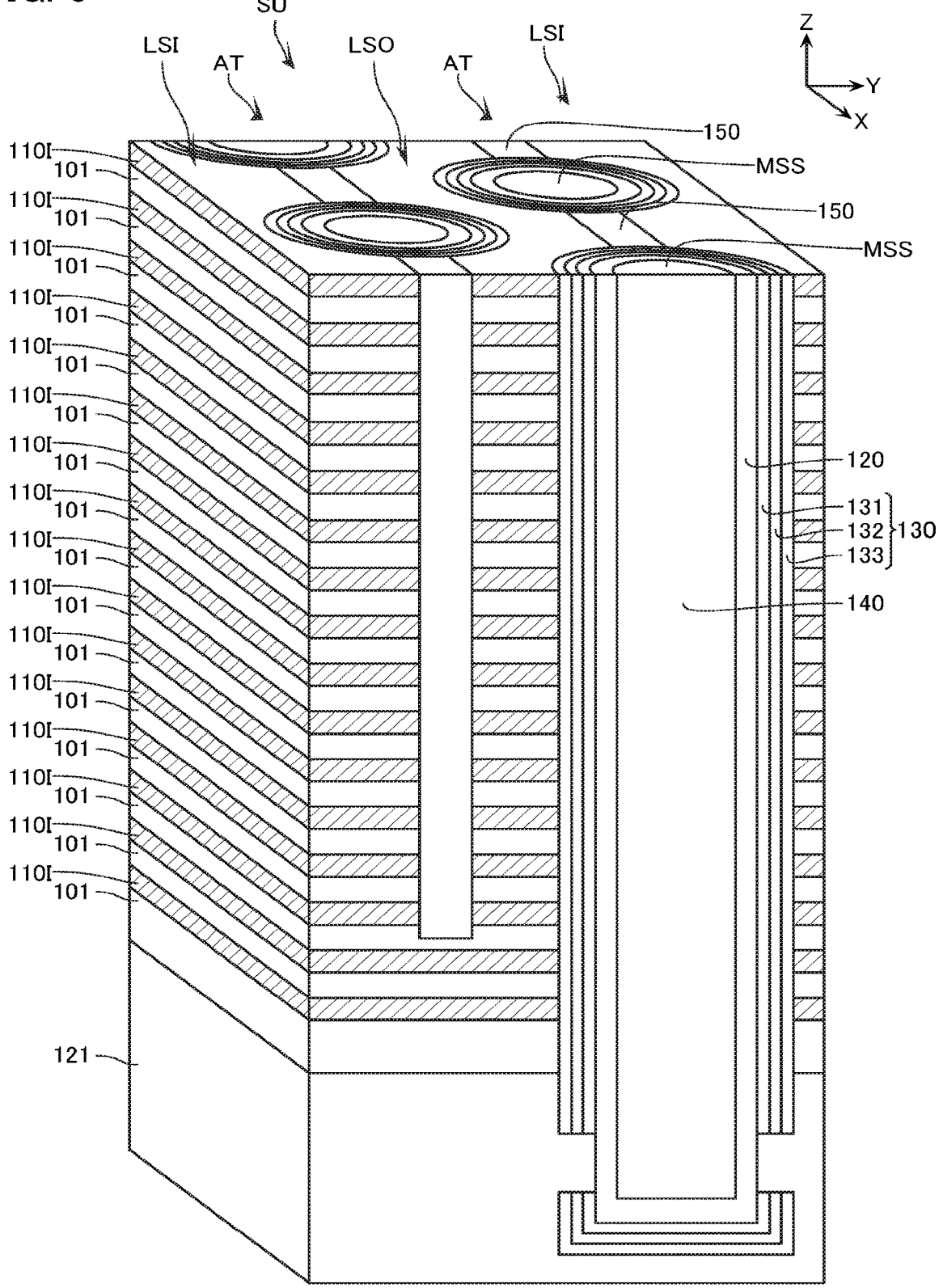
FIG. 6 is a schematic perspective view showing a part of the configuration of the semiconductor memory device.
Figure 7:
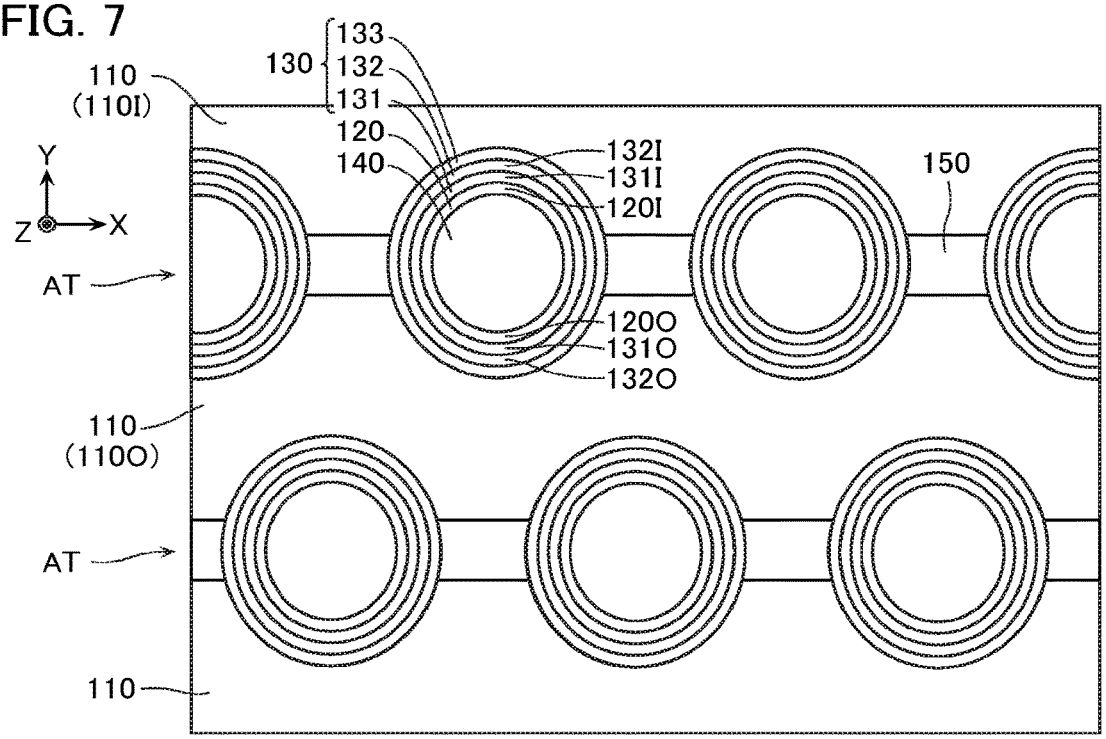
FIG. 7 is a schematic plan view showing a part of the configuration of the semiconductor memory device.

Next, an example of configuration of the semiconductor memory device according to the present embodiment will be described with reference to FIGS. 5 to 7. FIG. 5 is a schematic plan view showing a part of a configuration of the semiconductor memory device according to the present embodiment. FIG. 6 is a schematic perspective view showing a part of the configuration of the semiconductor memory device according to the present embodiment. FIG. 7 is a schematic plan view showing a part of the configuration of the semiconductor memory device according to the present embodiment.

As shown in FIG. 5, the semiconductor memory device according to the present embodiment comprises a semiconductor substrate 100. In the example illustrated, the semiconductor substrate 100 is provided with two memory cell array regions $R_{MCA}$ arranged in the X direction. At a position arranged in the X direction with the memory cell array region $R_{MCA}$, there is provided a row decoder region $R_{RD}$. Moreover, in an end portion in the Y direction of the semiconductor substrate 100, there is provided a peripheral circuit region $R_{PC}$.

The semiconductor substrate 100 includes the likes of single crystal silicon (Si) containing a P type impurity, for example. In an upper surface of the semiconductor substrate 100, there are provided an N type well including an N type impurity and a P type well including a P type impurity. Note that on a surface of the semiconductor substrate 100, there are provided the likes of a transistor or wiring configuring at least part of the peripheral circuit PC (FIG. 1), for example.

The memory cell array region $R_{MCA}$ is provided with a plurality of the memory blocks BLK arranged in the Y direction. The memory block BLK comprises a plurality of the string units SU, as has been described with reference to FIG. 1, and so on. As shown in FIG. 6, for example, the string unit SU comprises: a plurality of stacked body structures LSI, LSO arranged alternately in the Y direction; and a trench structure AT provided between these plurality of stacked body structures LSI, LSO. The stacked body structure LSI comprises a plurality of conductive layers 110I stacked in the Z direction. The stacked body structure LSO comprises a plurality of conductive layers 110O stacked in the Z direction (refer to FIGS. 6 and 7). The trench structure AT comprises a plurality of memory string structures MSS arranged in the X direction. Each memory string structure MSS comprises: a substantially cylindrically-shaped semiconductor layer 120 extending in the Z direction; a gate insulating layer 130 provided between the stacked body structures LSI, LSO and semiconductor layer 120; and an insulating layer 140 of the likes of silicon oxide ($SiO_2$) provided in a center portion of the semiconductor layer 120. Moreover, an insulating layer 150 of the likes of silicon oxide ($SiO_2$) is provided between the plurality of memory string structures MSS arranged in the X direction.

The conductive layers 110I, 110O, which are substantially plate-like conductive layers extending in the X direction, are, for example, a stacked film of titanium nitride (TiN) and tungsten (W), or a conductive layer of the likes of polycrystalline silicon (Si) implanted with an impurity. An insulating layer 101 of the likes of silicon oxide ($SiO_2$) is provided between the plurality of conductive layers 110I, 110O arranged in the Z direction.

One or a plurality of the most downwardly located conductive layers 110I, 110O function as the gate electrode of the source side select transistor STSB and as the source side select gate line SGSB.

One or a plurality of the next most upwardly located conductive layers 110I, 110O function as the gate electrode of the source side select transistor STS and as the source side select gate line SGS.

A plurality of the next most upwardly located conductive layers 110I, 110O respectively function as the gate electrodes of the memory cells MCI and as the word lines WLI, or as the gate electrodes of the memory cells MCO and as the word lines WLO.

One or a plurality of the next most upwardly located conductive layers 110I, 110O function as the gate electrode of the drain side select transistor STD and as the drain side select gate line SGD.

One or a plurality of the next most upwardly located conductive layers 110I, 110O function as the gate electrode of the drain side select transistor STDT and as the drain side select gate line SGDT.

The semiconductor layer 120 includes the likes of non-doped polycrystalline silicon (Si), for example. The semiconductor layer 120 has a substantially cylindrical shape, as mentioned above. Note that in the description below, a region facing the plurality of conductive layers 110I, of the semiconductor layer 120 will sometimes be referred to as a region 120I (FIG. 7), and a region facing the plurality of conductive layers 110O, of the semiconductor layer 120 will sometimes be referred to as a region 120O (FIG. 7). The region 120I functions as channel regions of the plurality of memory cells MCI and the select transistors (STSB, STS, STD, STDT) included in the memory string MSI (FIG. 2). The region 120O functions as channel regions of the plurality of memory cells MCO and the select transistors (STSB, STS, STD, STDT) included in the memory string MSO (FIG. 2).

A lower end of the semiconductor layer 120 is connected with a semiconductor layer 121 (FIG. 6). The semiconductor layer 121 includes the likes of polycrystalline silicon (Si) containing an N type impurity such as phosphorus (P), for example. The semiconductor layer 121 functions as the source line SL (FIG. 2).

Moreover, an upper end of the semiconductor layer 120 has formed therein an impurity layer of the likes of polycrystalline silicon (Si) including an N type impurity such as phosphorus (P), although illustration of this is omitted. The semiconductor layer 120 is electrically connected to the bit line BL (FIG. 2), via this impurity layer.

The gate insulating layer 130, which has a substantially cylindrical shape, extends in the Z direction along an outer peripheral surface of the semiconductor layer 120. The gate insulating layer 130 comprises a tunnel insulating layer 131 of the likes of silicon oxide ($SiO_2$), a charge storage layer 132 of the likes of silicon nitride (SiN), and a block insulating layer 133 of the likes of silicon oxide ($SiO_2$), that are provided from a semiconductor layer 120 side to conductive layer 110I, 110O sides.

Note that in the description below, a region provided between the conductive layer 110I and the region 120I of the semiconductor layer 120, of the charge storage layer 132 will sometimes be referred to as a region 132I (FIG. 7), and a region provided between the conductive layer 110O and the region 120O of the semiconductor layer 120, of the charge storage layer 132 will sometimes be referred to as a region 132O (FIG. 7). Similarly, in the description below, a region provided between the above-described region 120I and region 132I, of the tunnel insulating layer 131 will sometimes be referred to as a region 131I (FIG. 7), and a region provided between the above-described region 120O and region 132O, of the tunnel insulating layer 131 will sometimes be referred to as a region 131O (FIG. 7).

[Threshold Voltages of Memory Cells MCI, MCO]

Next, threshold voltages of the memory cells MCI, MCO will be described with reference to FIG. 8.

As mentioned above, the memory cell array MCA comprises a plurality of the memory cells MCI, MCO. When a write operation is executed on these plurality of memory cells MCI, MCO, the threshold voltages of these memory cells MCI, MCO are controlled to multiple types of states.

Figure 8:
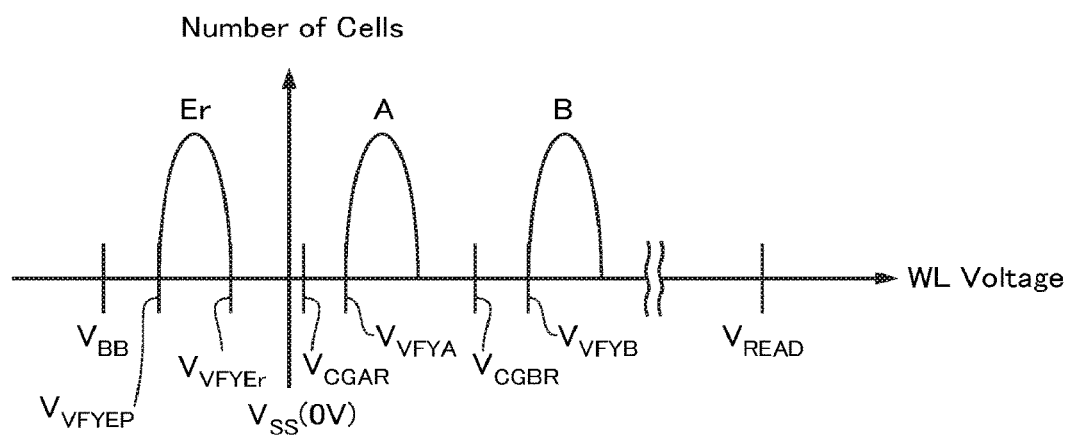
FIG. 8 is a schematic histogram for explaining threshold voltages of memory cells MCI, MCO stored with multiple-bit data.

FIG. 8 is a schematic histogram for explaining threshold voltages of the memory cells MCI, MCO stored with multiple-bit data. The horizontal axis indicates voltages of the word lines WLI, WLO, and the vertical axis indicates the number of memory cells MCI, MCO.

FIG. 8 illustrates three distributions of threshold voltages of the memory cells MCI, MCO. For example, threshold voltages of the memory cells MCI, MCO controlled to an Er state are larger than a read block voltage $V_{DD}$, and smaller than a read voltage $V_{CGAR}$. Note that threshold distribution of the Er state is controlled so that magnitude of its smallest threshold voltage is about an EP verify voltage $V_{VFYEP}$. Moreover, threshold distribution of the Er state is controlled so that magnitude of its largest threshold voltage is about an erase verify voltage $V_{VFYEr}$. Moreover, threshold voltages of the memory cells MCI, MCO controlled to an A state are larger than the read voltage $V_{CGAR}$, and smaller than a read voltage $V_{CGBR}$. Note that threshold distribution of the A state is controlled so that magnitude of its smallest threshold voltage is about a verify voltage $V_{VFYA}$. Moreover, threshold voltages of the memory cells MCI, MCO controlled to a B state are larger than the read voltage $V_{CGBR}$. Note that threshold distribution of the B state is controlled so that its smallest threshold voltage is about a verify voltage $V_{VFYB}$. Moreover, threshold voltage of all of the memory cells MCI, MCO is smaller than a read pass voltage $V_{READ}$.

These threshold distributions are each assigned with 1-bit or multiple-bit data.

In the case where, for example, 3-bit data is assigned to the memory cells MCI, MCO, threshold voltages of the memory cells MCI, MCO are controlled to belong to any of $2^3=8$ types of threshold distributions. Moreover, these 8 types of threshold distributions are each assigned with any of data "0, 0, 0", "0, 0, 1", "0, 1, 0", "0, 1, 1", "1, 0, 0", "1, 0, 1", "1, 1, 0", and "1, 1, 1".

Moreover, in the case where, for example, 1-bit data is assigned to the memory cells MCI, MCO, threshold voltages of the memory cells MCI, MCO are controlled to belong to either one of $2^1=2$ types of threshold distributions. Moreover, these 2 types of threshold distributions are each assigned with either one of data "0" and "1".

[Read Operation]

Figure 9:
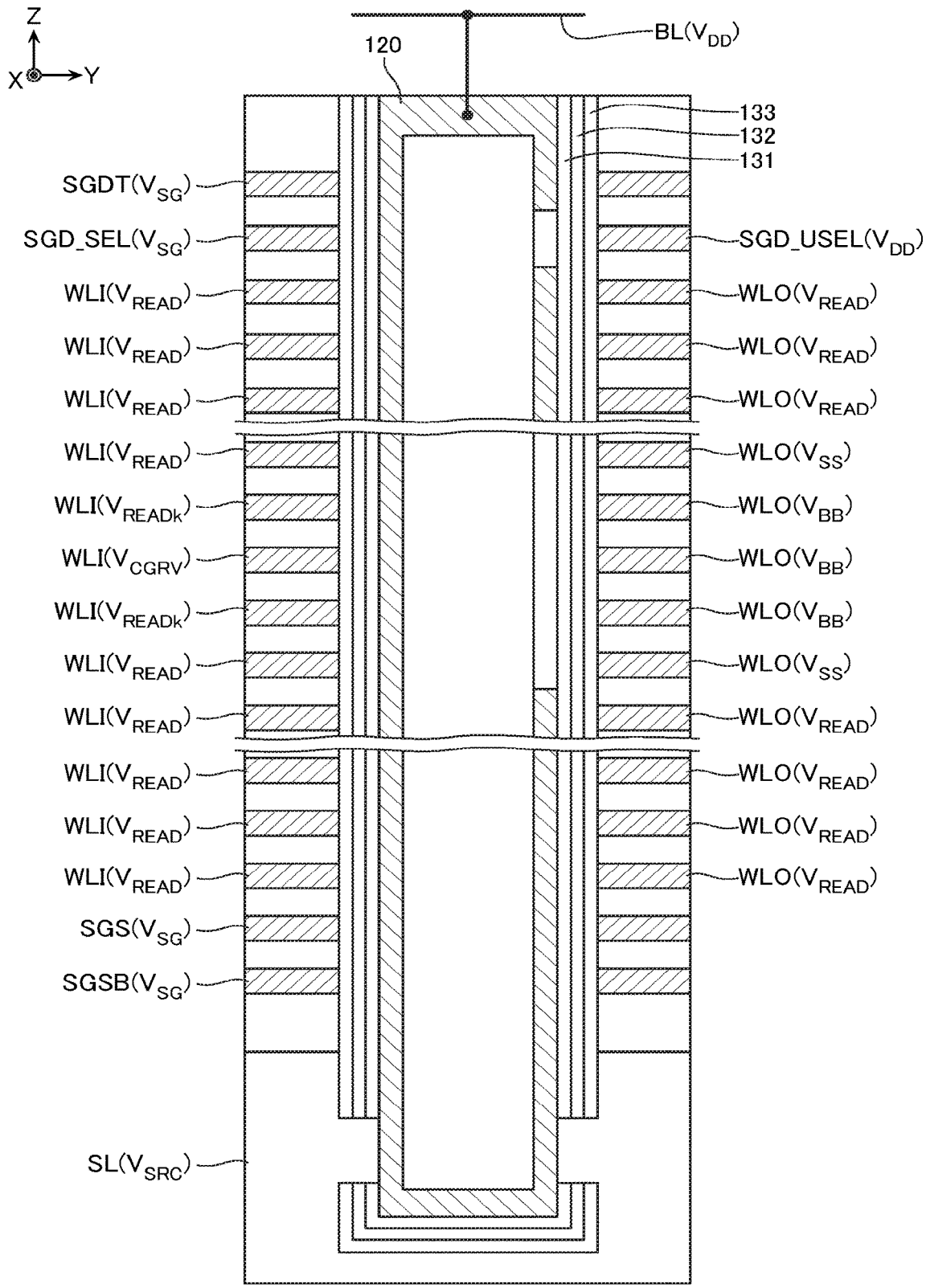
FIG. 9 is a schematic cross-sectional view for explaining a read operation.

FIG. 9 is a schematic cross-sectional view for explaining a read operation.

Note that the read operation according to the present embodiment is executed in a batch on all of the memory cells MCI, MCO included in a designated string unit SU in a designated memory block BLK and connected to a designated word line WLI or word line WLO. Hereafter, a configuration including such a plurality of memory cells MCI, MCO will sometimes be referred to as a page portion.

Moreover, in the description below, there will be described an example where the read operation is executed on the page portion corresponding to a memory string MSI (FIG. 2). Moreover, in the description below, the drain side select gate line SGD corresponding to a selected memory string MSI (FIG. 2), of the drain side select gate lines SGD will sometimes be referred to as a drain side select gate line SGD_SEL, and the drain side select gate line SGD corresponding to an unselected memory string MSO, of the drain side select gate lines SGD will sometimes be referred to as a drain side select gate line SGD_USEL.

During the read operation, as shown in FIG. 9, for example, the bit line BL is applied with the voltage $V_{DD}$. Moreover, the source line SL is applied with the voltage $V_{SRC}$. The voltage $V_{SRC}$ is larger than the ground voltage $V_{SS}$. The voltage $V_{DD}$ is larger than the voltage $V_{SRC}$.

Moreover, the drain side select gate lines SGDT, SGD_SEL are applied with a voltage $V_{SG}$. The voltage $V_{SG}$ is larger than the voltage $V_{DD}$. Moreover, a difference between the voltage $V_{SG}$ and the voltage $V_{DD}$ is larger than a threshold voltage of the drain side select transistors STDT, STD when operated as NMOS transistors. Hence, the channel regions of the drain side select transistors STDT, STD corresponding to the selected memory string MSI have a channel of electrons formed therein.

Moreover, the drain side select gate line SGD_USEL is applied with the voltage $V_{DD}$. Hence, the channel region of the drain side select transistor STD corresponding to the unselected memory string MSO does not have a channel formed therein.

Moreover, the two unselected word lines WLI adjacent to a selected word line WLI in the Z direction are applied with a read pass voltage $V_{READk}$. Moreover, unselected word lines WLI other than those two, are applied with the read pass voltage $V_{READ}$. The read pass voltage $V_{READk}$ is larger than the read pass voltage $V_{READ}$. As a result, the channel regions of the plurality of unselected memory cells MCI have a channel of electrons formed therein.

Moreover, the selected word line WLI is applied with a read voltage $V_{CGRV}$. The read voltage $V_{CGRV}$ is any of the read voltages $V_{CGAR}$, $V_{CGBR}$ . . . described with reference to FIG. 8, for example. Therefore, a channel of electrons is formed or not formed in the channel region of the selected memory cell MCI, depending on data that has been stored in the selected memory cell MCI.

Moreover, the word line WLO adjacent in the Y direction to the selected word line WLI, and the two unselected word lines WLO adjacent to this word line WLO in the Z direction are applied with the read block voltage $V_{BB}$. Moreover, the word lines WLO one above and one below these three word lines WLO are applied with the ground voltage $V_{SS}$. Hence, the channel regions of the memory cells MCO connected to these five word lines WLO do not have a channel formed therein.

Moreover, the word lines WLO other than these five word lines WLO are applied with the read pass voltage $V_{READ}$. Therefore, the channel regions of the plurality of unselected memory cells MCO have a channel of electrons formed therein.

Moreover, the source side select gate lines SGS, SGSB are applied with the voltage $V_{SG}$. Therefore, the channel regions of the source side select transistors STS, STSB have a channel of electrons formed therein.

Now, when a channel of electrons has been formed in the channel region of the selected memory cell MCI, a current flows in the bit line BL. On the other hand, when a channel of electrons has not been formed in the channel region of the selected memory cell MCI, a current does not flow in the bit line BL. In the read operation, a current of the bit line BL is detected by the sense amplifier module SAM (FIG. 3), thereby enabling data indicating ON/OFF state of the selected memory cell MCI to be acquired. Hereafter, such an operation will be referred to as a "sense operation".

During execution of the sense operation, the sense node SEN described with reference to FIG. 3 is priorly charged up to the voltage $V_{DD}$ via the charge transistor 47. Moreover, the wiring LBUS described with reference to FIG. 3 is priorly charged via the charge transistor 55.

In the sense operation, for example, in a state where the bit line BL is being applied with the voltage $V_{DD}$, a signal of the signal line HLL is set to an "L" state to electrically isolate the sense node SEN from the node N1, and signals of the signal lines XXL, BLC, BLS are set to an "H" state to make the sense node SEN electrically continuous with the bit line BL. Moreover, a signal of the internal control signal line CLKSA is activated. Now, when a channel of electrons has been formed in the channel region of the selected memory cell MCI, charge of the sense node SEN is discharged, and voltage of the sense node SEN falls. On the other hand, when a channel of electrons has not been formed in the channel region of the selected memory cell MCI, charge of the sense node SEN is not discharged, and voltage of the sense node SEN does not fall. After the sense node SEN has been made electrically continuous with the bit line BL for a certain time, the signal of the signal line XXL is set to an "L" state to separate the sense node SEN from the bit line BL. Note that in the description below, the time the sense node SEN is made electrically continuous with the bit line BL will sometimes be referred to as a "sense time".

Moreover, in the sense operation, for example, the signal of the internal control signal line CLKSA is deactivated. Now, when charge of the sense node SEN has been discharged, voltage of the sense node SEN is in a comparatively low state, hence the sense transistor 41 is in an OFF state. On the other hand, when charge of the sense node SEN has not been discharged, voltage of the sense node SEN is maintained in a comparatively high state, hence the sense transistor 41 is maintained in an ON state.

Moreover, in the sense operation, for example, a signal of the signal line STB is activated to set the switch transistor 42 to an ON state. Now, when the sense transistor 41 is in an OFF state, charge in the wiring LBUS is maintained. On the other hand, when the sense transistor 41 is in an ON state, charge in the wiring LBUS is discharged. Hence, by a state of the wiring LBUS being latched by any of the latch circuits SDL, DL0-DLn in this state, it is possible for data indicating the ON/OFF state of the selected memory cell MCI to be acquired.

For example, when 1-bit data is stored by the selected memory cell MCI, this data indicating ON/OFF state is read as the data stored in the selected memory cell MCI. Moreover, when multiple-bit data is stored by the selected memory cell MCI, data indicating a plurality of ON/OFF states corresponding to a plurality of read voltages $V_{CGRV}$ are acquired as required, these data indicating the plurality of ON/OFF states undergo arithmetic processing, and a result of this arithmetic processing is read as the data stored in the selected memory cell MCI.

Note that in FIG. 9, a part of the word lines WLO are applied with the read block voltage $V_{BB}$, a part of the word lines WLO are applied with the ground voltage $V_{SS}$, and the word lines WLO other than these are applied with the read pass voltage $V_{READ}$. However, such a configuration is merely an exemplification, and a specific method is appropriately adjustable. For example, all of the word lines WLO may be applied with the read block voltage $V_{BB}$.

[Write Operation]

Figure 10:
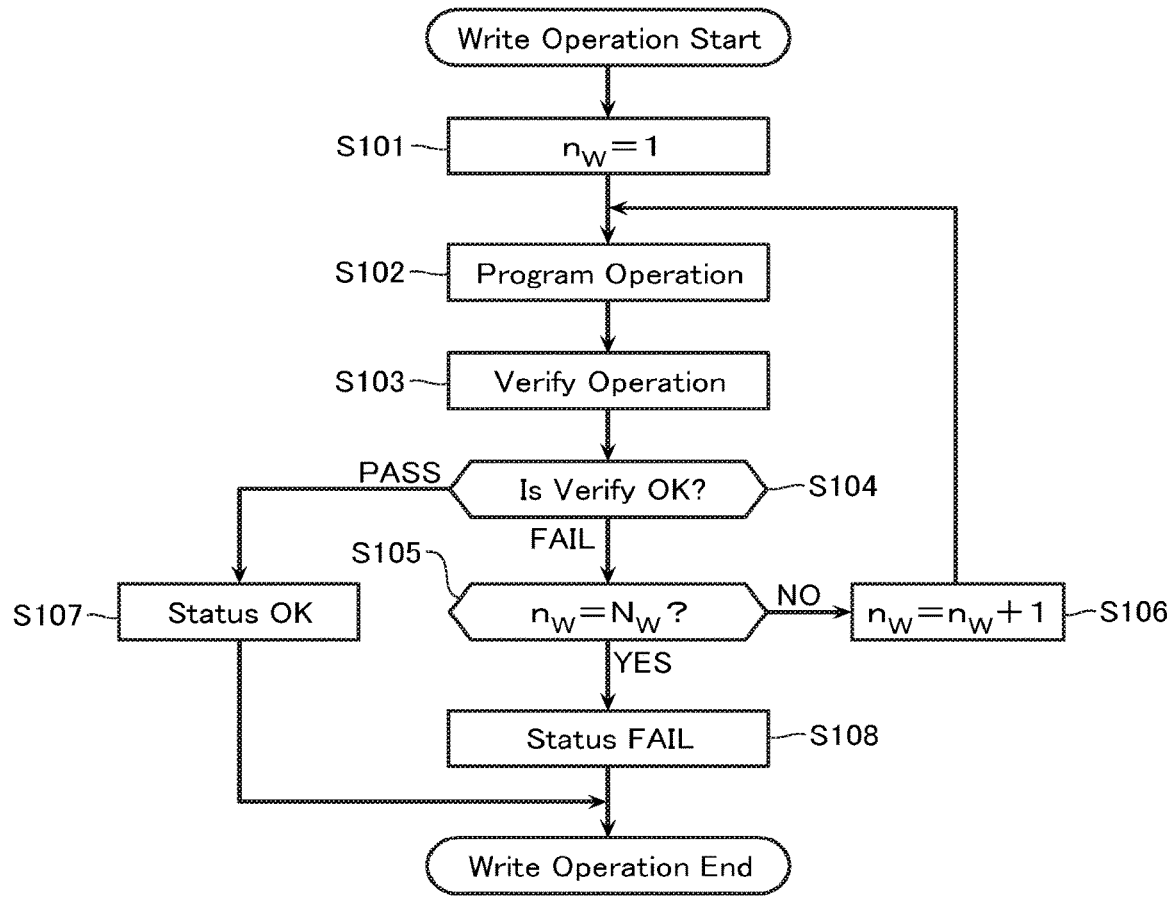
FIG. 10 is a schematic flowchart for explaining a write operation.

FIG. 10 is a schematic flowchart for explaining a write operation.

Note that in the present specification, an operation in which a selected word line WLI is applied with a program voltage $V_{PGM}$ will be referred to as a "program operation", and an operation in which the program operation and a verify operation are executed at least one time each will be referred to as a "write operation". For example, in the example of FIG. 10, the operation represented by the flowchart overall is a "write operation", and the operation of step S102 within the write operation is a "program operation".

In the description below, there will be described an example where the write operation is executed on the page portion corresponding to the memory string MSI (FIG. 2).

In step S101, a loop count $n_W$ is set to 1. The loop count $n_W$ is a variable indicating the number of times of a write loop. Moreover, user data to be written to the selected memory cell MCI is latched in the latch circuits DL0-DLn of the sense amplifier unit SAU (FIG. 3), for example.

In step S102, the program operation is executed. The program operation is an operation in which, by the selected word line WLI being applied with the program voltage $V_{PGM}$, the threshold voltage of the memory cell MCI is caused to increase.

In step S103, the verify operation is executed. The verify operation is an operation for detecting whether the threshold voltage of the selected memory cell MCI has reached its target value or not, by applying the selected word line WLI with a verify voltage and acquiring data indicating ON state/OFF state of the memory cell MCI.

In step S104, a result of the verify operation is judged. For example, the number of data items indicating ON state, among data items indicating ON state/OFF state of the memory cell MCI is acquired with reference to an unillustrated counter circuit. Moreover, in such cases as when the number of data items indicating ON state is a certain number or more, there is judged to have been verify FAIL, and processing proceeds to step S105. On the other hand, in such cases as when the number of data items indicating ON state is less than the certain number, there is judged to have been verify PASS, and processing proceeds to step S107.

In step S105, it is judged whether the loop count n w has reached a predetermined count $N_W$, or not. When the loop count $n_W$ has not reached the predetermined count $N_W$, processing proceeds to step S106. When the loop count $n_W$ has reached the predetermined count $N_W$, processing proceeds to step S108.

In step S106, 1 is added to the loop count $n_W$, whereupon processing proceeds to step S102. Moreover, in step S106, for example, a certain voltage LV is added to the program voltage $V_{PGM}$. Hence, the program voltage $V_{PGM}$ increases along with increase in the loop count $n_W$.

In step S107, status data to the effect that the write operation ended normally is stored in an unillustrated status register, and the write operation ends.

In step S108, status data to the effect that the write operation did not end normally is stored in the unillustrated status register, and the write operation ends.

[Program Operation]

Figure 11:
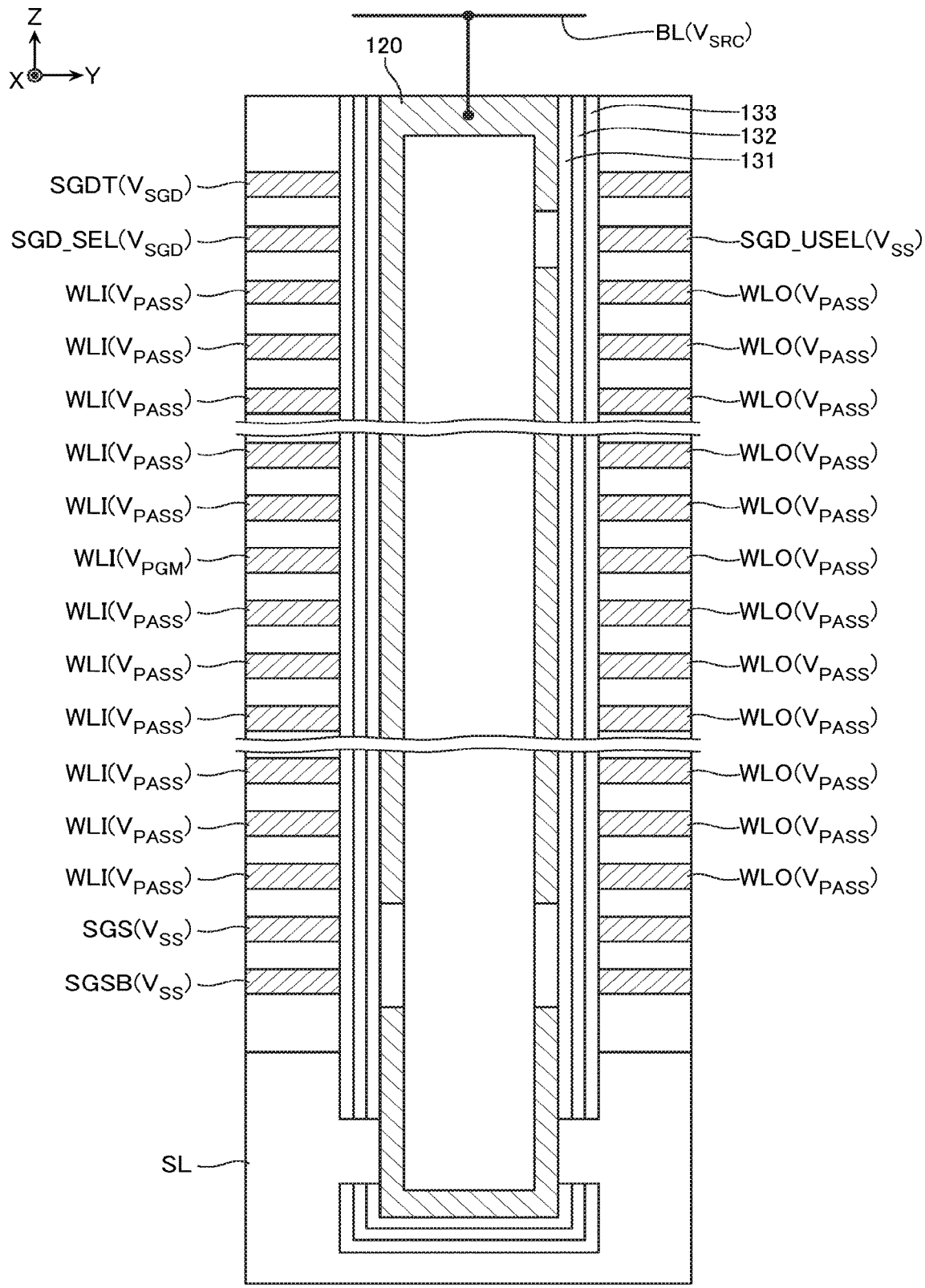
FIG. 11 is a schematic cross-sectional view for explaining a program operation.

FIG. 11 is a schematic cross-sectional view for explaining the program operation.

In the program operation, for example, a bit line BL which is connected to those ones of the plurality of selected memory cells MCI that are to undergo adjustment of their threshold voltage, is applied with the voltage $V_{SRC}$. Moreover, a bit line BL which is connected to those ones of the plurality of selected memory cells MCI that are not to undergo adjustment of their threshold voltage, is applied with the voltage $V_{DD}$, although illustration of this latter case is omitted. For example, the latch circuits SDL (FIG. 3) corresponding to a part of the bit lines BL are latched with "L", and the latch circuits SDL (FIG. 3) corresponding to a part of the bit lines BL are latched with "H". Moreover, states of the signal lines STB, XXL, BLC, BLS, HLL, BLX are set to "L, L, H, H, L, H". Hereafter, some one of the plurality of selected memory cells MCI that is to undergo adjustment of its threshold voltage will sometimes be referred to as a "write memory cell MCI", and some one of the plurality of selected memory cells MCI that is not to undergo adjustment of its threshold voltage will sometimes be referred to as a "prohibit memory cell MCI".

Moreover, in the program operation, the drain side select gate lines SGDT, SGD_SEL are applied with a voltage $V_{SGD}$.

The voltage $V_{SGD}$ is larger than the voltage $V_{SRC}$. Moreover, a voltage difference between the voltage $V_{SGD}$ and the voltage $V_{SRC}$ is larger than a threshold voltage of the drain side select transistors STDT, STD when operated as NMOS transistors. Hence, the channel region of the drain side select transistor STD connected to the write memory cell MCI has a channel of electrons formed therein, and has the voltage $V_{SRC}$ transferred thereto.

On the other hand, a voltage difference between the voltage $V_{SGD}$ and the voltage $V_{DD}$ is smaller than a threshold voltage of the drain side select transistors STDT, STD when functioning as NMOS transistors. Hence, the drain side select transistor STD connected to the prohibit memory cell MCI becomes an OFF state.

Moreover, in the program operation, the source line SL is applied with the voltage $V_{SRC}$, and the source side select gate lines SGS, SGSB are applied with the ground voltage $V_{SS}$. As a result, the source side select transistors STS, STSB become an OFF state.

Moreover, in the program operation, the unselected word lines WLI and the word lines WLO are applied with a write pass voltage $V_{PASS}$. The write pass voltage $V_{PASS}$ is larger than the read pass voltage $V_{READ}$. Moreover, a voltage difference between the write pass voltage $V_{PASS}$ and the voltage $V_{SRC}$ is larger than threshold voltages of the memory cell MCI when operated as an NMOS transistor, regardless of data stored in the memory cell MCI. Hence, the channel regions of the unselected memory cells MCI, MCO have a channel of electrons formed therein, and the write memory cell MCI has the voltage $V_{SRC}$ transferred thereto.

Moreover, in the program operation, the selected word line WLI is applied with the program voltage $V_{PGM}$. The program voltage $V_{PGM}$ is larger than the write pass voltage $V_{PASS}$.

Now, the channel region of the write memory cell MCI is applied with the voltage $V_{SRC}$. Between such a semiconductor layer 120 and the selected word line WLI, there is generated a comparatively large electric field. As a result, electrons in the channel of the semiconductor layer 120 tunnel into the charge storage layer 132 (FIG. 6) via the tunnel insulating layer 131 (FIG. 6). As a result, the threshold voltage of the write memory cell MCI increases.

Moreover, the channel region of the prohibit memory cell MCI is electrically in a floating state, and a voltage of its channel rises to about the write pass voltage $V_{PASS}$ due to capacitive coupling with the unselected word lines WLI and the word lines WLO. Between such a semiconductor layer 120 and the selected word line WLI, there is generated an electric field which is smaller than the above-described electric field. Hence, electrons in the channel of the semiconductor layer 120 do not tunnel into the charge storage layer 132 (FIG. 6). Hence, the threshold voltage of the prohibit memory cell MCI does not increase.

[Verify Operation]

Figure 12:
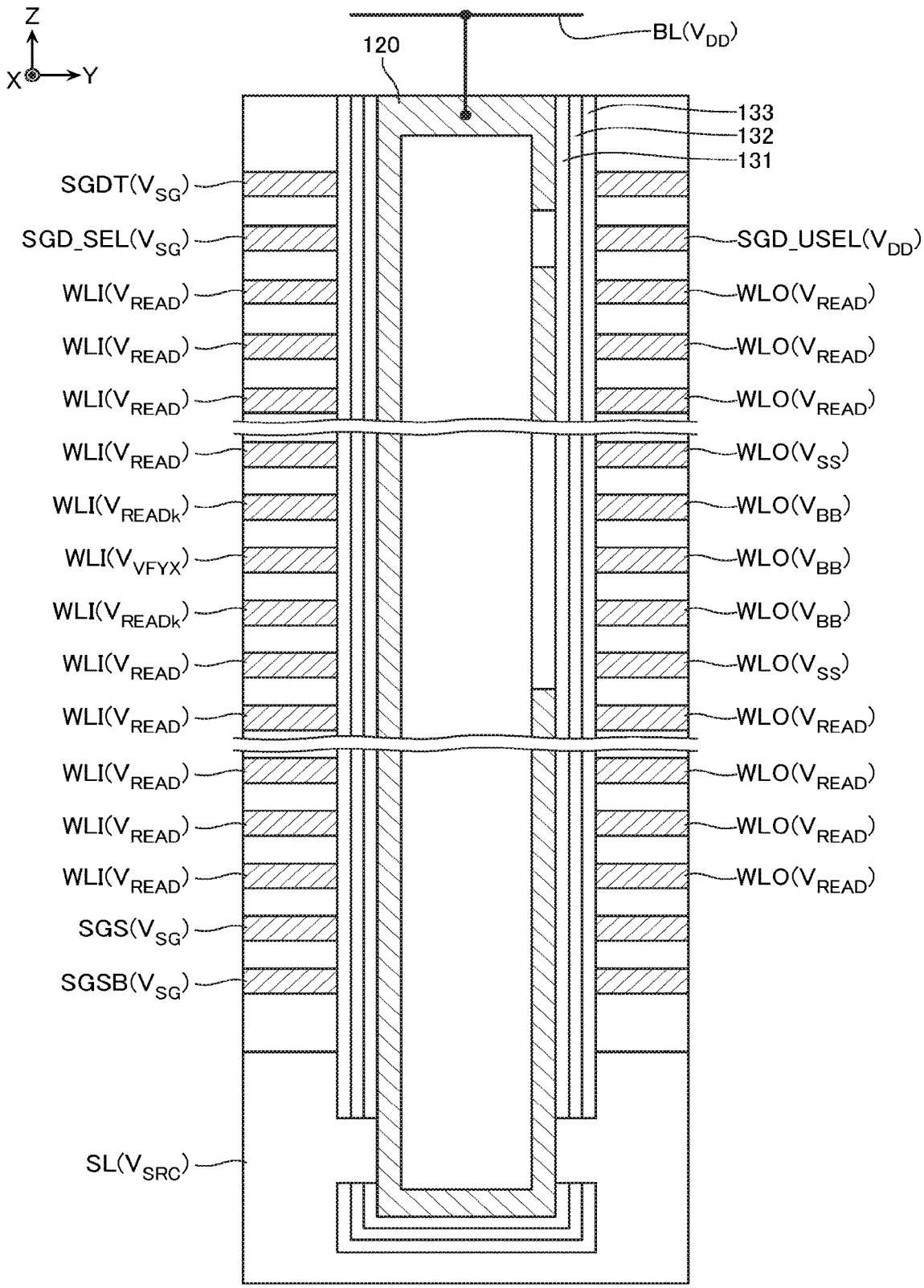
FIG. 12 is a schematic cross-sectional view for explaining a verify operation.

FIG. 12 is a schematic cross-sectional view for explaining the verify operation.

The verify operation is basically executed similarly to the read operation.

However, in the verify operation, the selected word line WLI is applied not with the read voltage $V_{CGRV}$, but with a verify voltage $V_{VFYX}$. The verify voltage $V_{VFYX}$ is any of the verify voltages $V_{VFYA}$, $V_{VFYD}$ . . . described with reference to FIG. 8, for example.

Moreover, in the read operation, for example, all of the bit lines BL corresponding to the page portion are applied with the voltage $V_{DD}$. On the other hand, in the verify operation, for example, a bit line BL connected to a memory cell MCI corresponding to a specific state may be applied with the voltage $V_{DD}$, and other bit lines BL may be applied with the voltage $V_{SRC}$, based on data in the latch circuits DL0-DLn.

[Erase Operation]

Next, an erase operation of the semiconductor memory device according to the present embodiment will be described.

Figure 13:
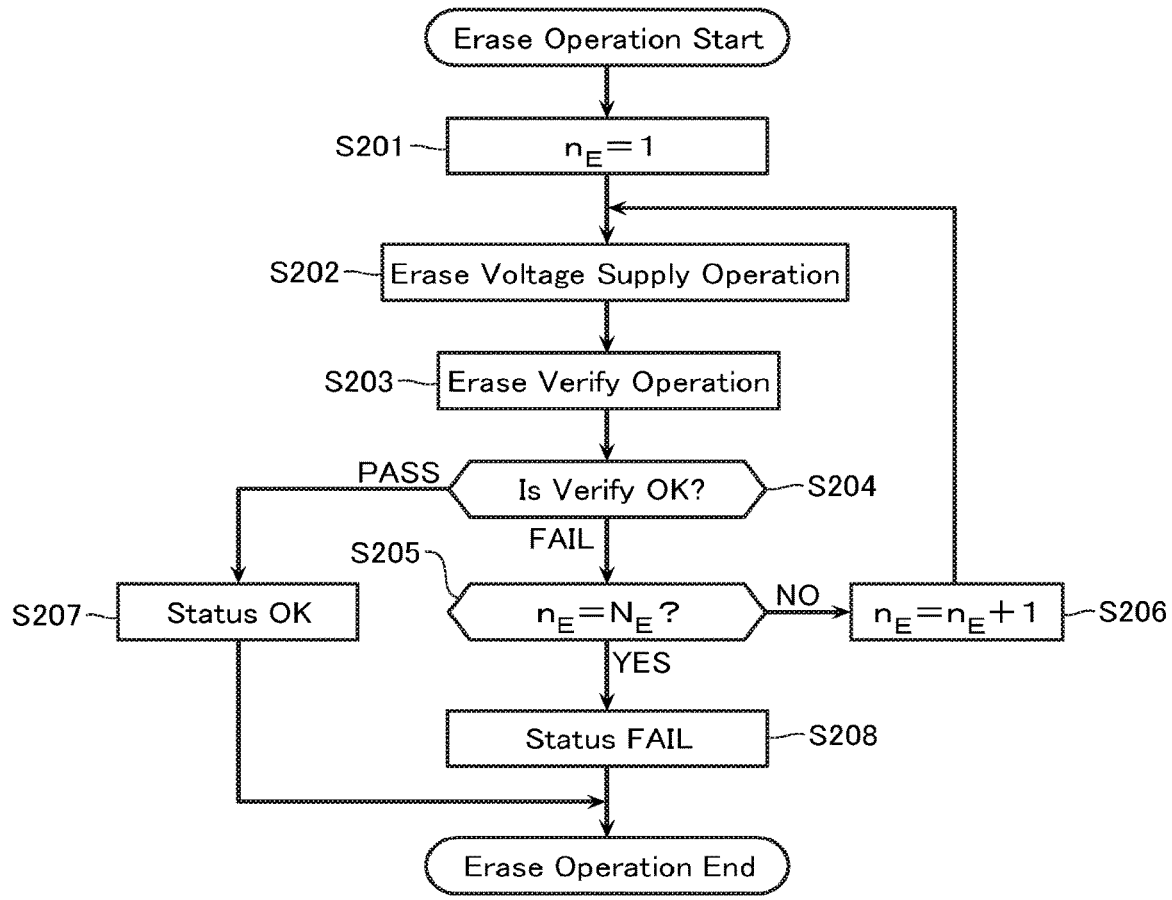
FIG. 13 is a flowchart for explaining an erase operation.

FIG. 13 is a flowchart for explaining the erase operation.

Note that in the present specification, an operation in which at least one of the bit line BL and the source line SL is applied with an erase voltage $V_{ERA}$ will be referred to as an "erase voltage supply operation", and an operation in which the erase voltage supply operation and an erase verify operation are executed at least one time each will be referred to as an "erase operation". For example, in the example of FIG. 13, the operation represented by the flowchart overall is an "erase operation", and the operation of step S202 within the erase operation is an "erase voltage supply operation".

Note that in the description below, there will be described an example where the erase operation is executed on a memory block BLK representing a target of the operation.

In step S201, as shown in FIG. 13, for example, loop count $n_E$ is set to 1. The loop count $n_E$ is a variable indicating the number of times of an erase loop.

In step S202, the erase voltage supply operation is executed. The erase voltage supply operation is an operation in which, by the word lines WLI, WLO being applied with the ground voltage $V_{SS}$, and at least one of the source line SL and bit line BL being applied with the erase voltage $V_{ERA}$, the threshold voltages of the memory cells MCI, MCO are caused to decrease.

In step S203, the erase verify operation is executed. The erase verify operation is an operation for detecting whether the threshold voltages of the memory cells MCI, MCO have reached their target value or not, by applying the word lines WLI, WLO with an erase verify voltage $V_{VFYEr}$, and acquiring data indicating ON state/OFF state of the memory cells MCI, MCO.

In step S204, a result of the erase verify operation is judged. For example, the number of data items indicating OFF state, among data items indicating ON state/OFF state of the memory cells MCI, MCO is acquired with reference to an unillustrated counter circuit. Moreover, in such cases as when the number of data items indicating OFF state is a certain number or more, there is judged to have been verify FAIL, and processing proceeds to step S205. On the other hand, in such cases as when the number of data items indicating OFF state is less than the certain number, there is judged to have been verify PASS, and processing proceeds to step S207.

In step S205, it is judged whether the loop count $n_E$ has reached a predetermined count $N_E$, or not. When the loop count $n_E$ has not reached the predetermined count $N_E$, processing proceeds to step S206. When the loop count n E has reached the predetermined count $N_E$, processing proceeds to step S208.

In step S206, 1 is added to the loop count $n_E$, whereupon processing proceeds to step S202. Moreover, in step S206, for example, a certain voltage ΔV is added to the erase voltage $V_{ERA}$. Hence, the erase voltage $V_{ERA}$ increases along with increase in the loop count $n_E$.

In step S207, status data to the effect that the erase operation ended normally is stored in an unillustrated status register, and the erase operation ends.

In step S208, status data to the effect that the erase operation did not end normally is stored in the unillustrated status register, and the erase operation ends.

[Erase Voltage Supply Operation]

Figure 14:
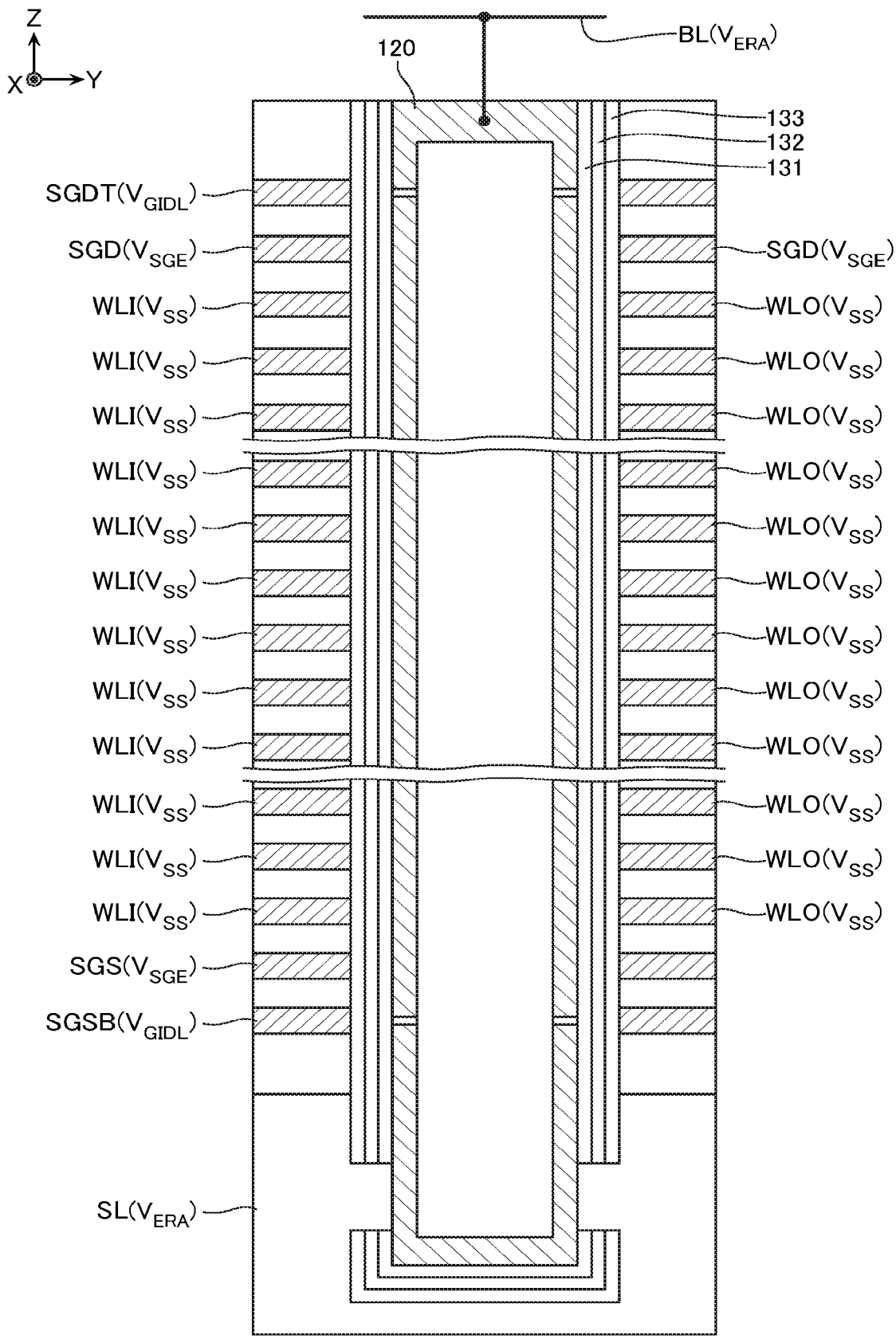
FIG. 14 is a schematic cross-sectional view for explaining an erase voltage supply operation.

FIG. 14 is a schematic cross-sectional view for explaining the erase voltage supply operation.

In the erase voltage supply operation, the bit line BL and source line SL are applied with the erase voltage $V_{ERA}$. The erase voltage $V_{ERA}$ may be larger than the program voltage $V_{PGM}$, or may be equal to the program voltage $V_{PGM}$, for example.

Moreover, in the erase voltage supply operation, the drain side select gate line SGDT and source side select gate line SGSB are applied with a voltage $V_{GIDL}$. The voltage $V_{GIDL}$ is smaller than the erase voltage $V_{ERA}$. As a result, GIDL (Gate Induced Drain Leakage) is generated and electron-hole pairs generated, in the drain side select transistor STDT and source side select transistor STSB. Moreover, the electrons move to a bit line BL side or source line SL side, and the holes move to memory cells MCI, MCO sides.

Moreover, in the erase voltage supply operation, the drain side select gate lines SGD and source side select gate line SGS are applied with a voltage $V_{SGE}$. The voltage $V_{SGE}$ is smaller than the erase voltage $V_{ERA}$. Moreover, a voltage difference between the voltage $V_{SGE}$ and the erase voltage $V_{ERA}$ is larger than a threshold voltage of the drain side select transistors STD and source side select transistor STS when operated as PMOS transistors. Hence, the channel regions of the drain side select transistors STD and source side select transistor STS have formed therein a channel of holes, and have transferred thereto the holes that have been generated in the drain side select transistor STDT and source side select transistor STSB.

Moreover, in the erase voltage supply operation, the word lines WLI, WLO are applied with the ground voltage $V_{SS}$. As a result, the holes in the channel of the semiconductor layer 120 tunnel into the charge storage layer 132 (FIG. 8) via the tunnel insulating layer 131 (FIG. 8). As a result, the threshold voltages of the memory cells MCI, MCO decrease.

Figure 15:
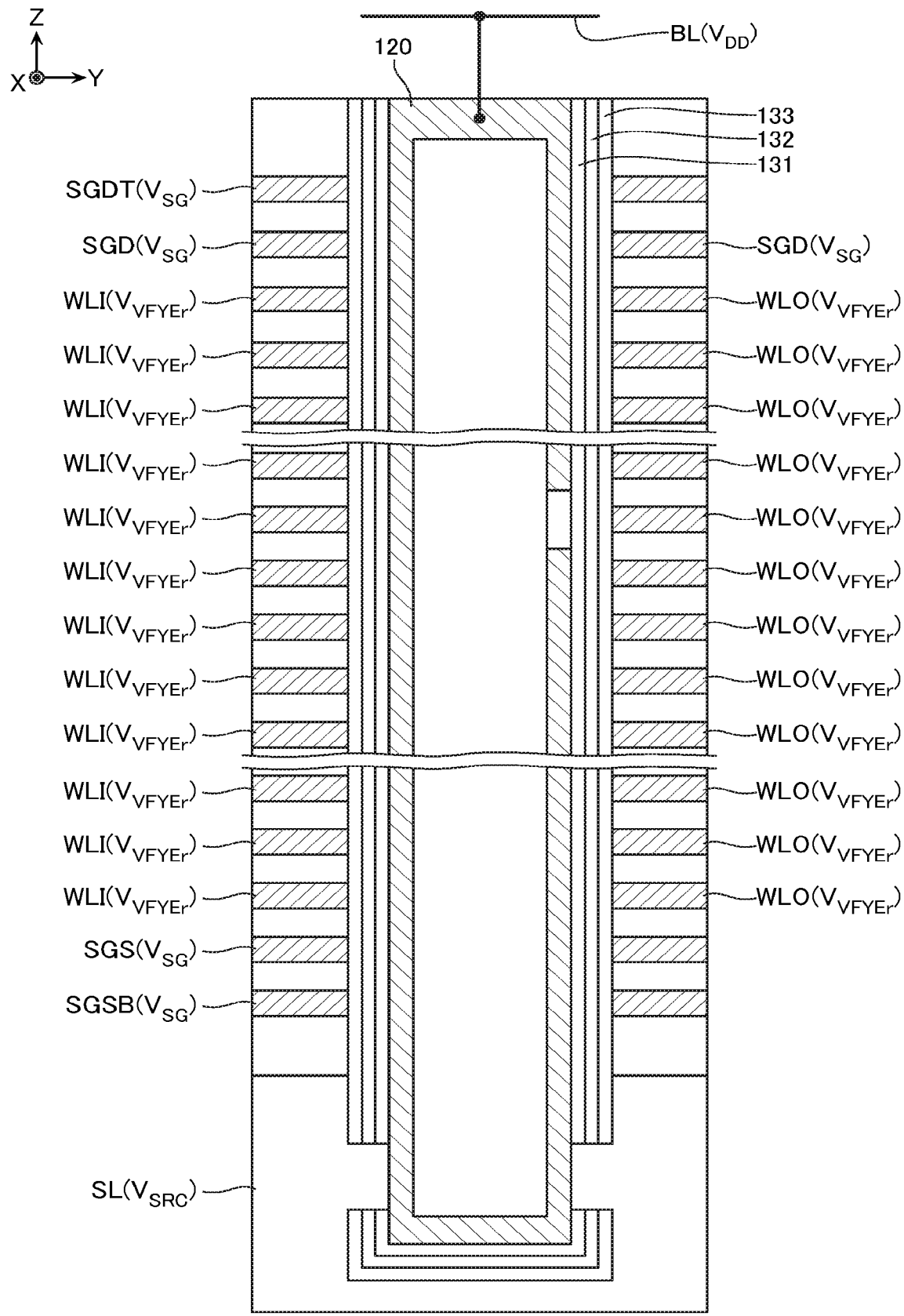
FIG. 15 is a schematic cross-sectional view for explaining an erase verify operation.

FIG. 15 is a schematic cross-sectional view for explaining the erase verify operation.

The erase verify operation is basically executed similarly to the read operation.

However, in the erase verify operation, the word lines WLI, WLO are applied neither with the read voltage $V_{CGRV}$ nor with the read pass voltage $V_{READ}$, but with the erase verify voltage $V_{VFYEr}$.

[Both-Side EP Write Operation]

As mentioned above, in the case where, for example, the read operation, verify operation, or erase verify operation is executed on the selected memory cell MCI in the memory string MSI, magnitude of current flowing in the bit line BL is detected, and data indicating ON/OFF state of the selected memory cell MCI thereby acquired.

Now, as has been described with reference to FIG. 6, the semiconductor layer 120 according to the present embodiment comprises a substantially cylindrical shape. Moreover, a portion facing the conductive layer 110I of the semiconductor layer 120 functions as the memory cell MCI in the memory string MSI. Moreover, a portion facing the conductive layer 110O of the semiconductor layer 120 functions as the memory cell MCO in the memory string MSO.

In this kind of structure, for example, when the memory cell MCO corresponding to the same semiconductor layer 120 as the selected memory cell MCI and provided at the same height position as the selected memory cell MCI (hereafter, this memory cell MCO will sometimes be referred to as a "reverse-side memory cell MCO") gets into an ON state, regardless of whether the selected memory cell MCI is in an ON state or is in an OFF state, the bit line BL and source line SL is electrically continuous via the reverse-side memory cell MCO, and a current flows into the bit line BL. As a result, the threshold voltage of the selected memory cell MCI cannot be preferably detected. It is therefore desirable for the reverse-side memory cell MCO to be set to an OFF state when the read operation, verify operation, and erase verify operation are executed.

Accordingly, in the present embodiment, in the read operation, verify operation, and erase verify operation, the gate electrode of the reverse-side memory cell MCO is applied with the read block voltage $V_{BB}$.

Figure 16:
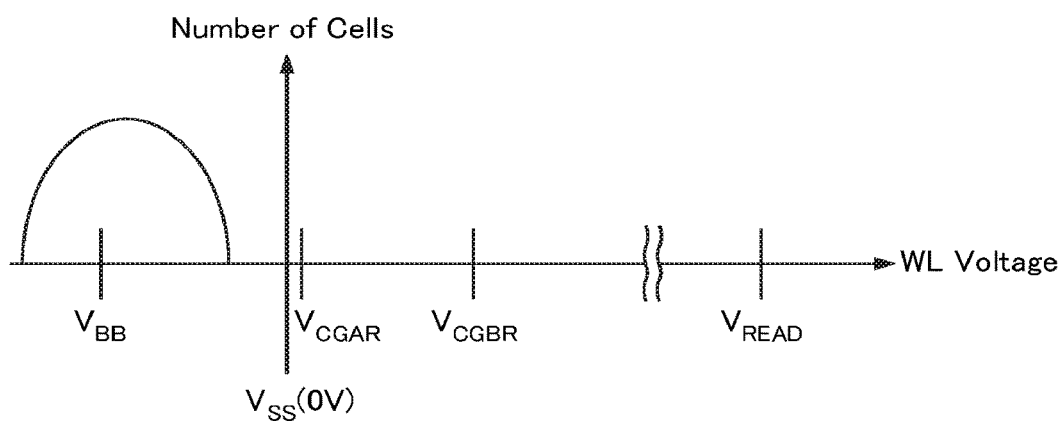
FIG. 16 is a schematic histogram for explaining a both-side EP write operation.

However, as shown in FIG. 16, for example, sometimes, immediately after execution of the erase operation, the threshold voltage of a part of the memory cells MCI, MCO becomes smaller than the read block voltage $V_{BB}$. In such a state, the reverse-side memory cell MCO sometimes cannot be set to an OFF state.

Figure 17:
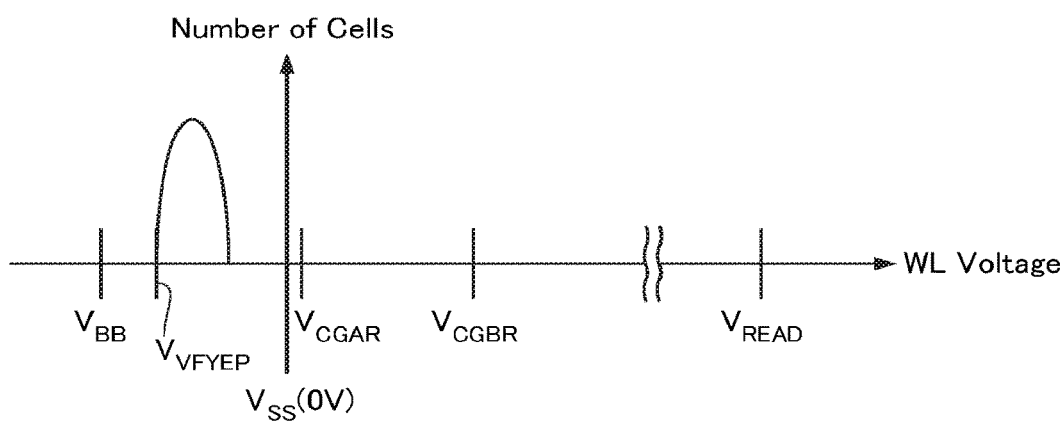
FIG. 17 is a schematic histogram for explaining the both-side EP write operation.

Accordingly, in the semiconductor memory device according to the present embodiment, after the erase operation has been executed and before the read operation or write operation is executed, a memory block BLK that has undergone execution of the erase operation undergoes execution of a both-side EP write operation. As a result, the threshold voltages of the memory cells MCI, MCO that have undergone execution of the erase operation are controlled in a range of being larger than the read block voltage $V_{BB}$, and smaller than the read voltage $V_{CGAR}$, as shown in FIG. 17, for example.

Figure 18:
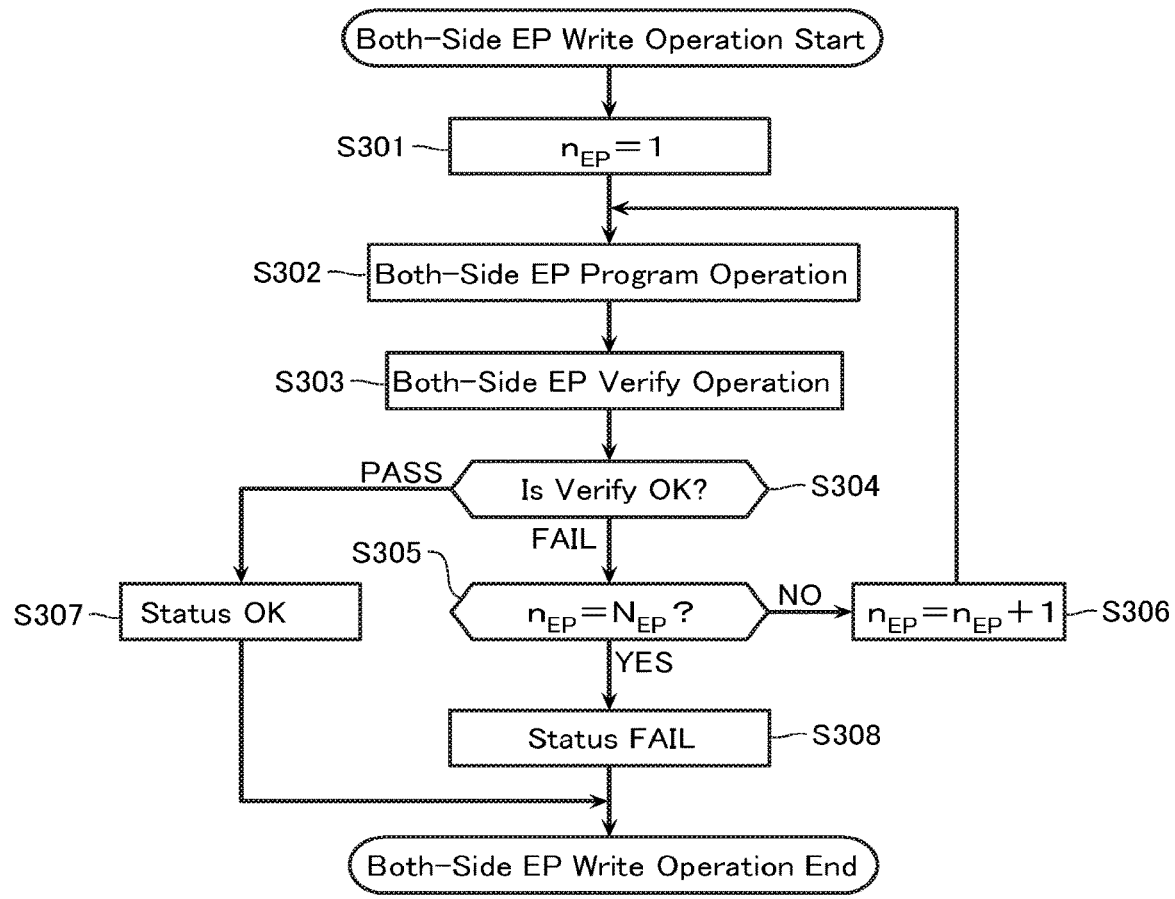
FIG. 18 is a schematic flowchart for explaining the both-side EP write operation.

FIG. 18 is a schematic flowchart for explaining the both-side EP write operation according to the present embodiment.

Note that in the present specification, an operation in which the word lines WLI, WLO are applied with a program voltage $V_{PGMEP}$ will be referred to as a "both-side EP program operation", and an operation in which the both-side EP program operation and a both-side EP verify operation are executed at least one time each will be referred to as a "both-side EP write operation". For example, in the example of FIG. 18, the operation represented by the flowchart overall is a "both-side EP write operation", and the operation of step S303 within the both-side EP write operation is a "both-side EP program operation".

The both-side EP write operation is simultaneously executed in the word lines WLI, WLO arranged in the Y direction. Moreover, the both-side EP write operation is sequentially executed on the plurality of word lines WLI, WLO arranged in the Z direction.

In step S301, a loop count $n_{EP}$ is set to 1. The loop count $n_{EP}$ is a variable indicating the number of times of a both-side EP write loop.

In step S302, the both-side EP program operation is executed. The both-side EP program operation is an operation in which, by selected word lines WLI, WLO being applied with the program voltage $V_{PGMEP}$, the threshold voltages of the memory cells MCI, MCO are caused to increase.

In step S303, the both-side EP verify operation is executed. The both-side EP verify operation is an operation for detecting whether the threshold voltages of the memory cells MCI, MCO have reached their target value or not, by applying the selected word lines WLI, WLO with an EP verify voltage $V_{VYFEP}$ and acquiring data indicating ON state/OFF state of the memory cells MCI, MCO. Note that each bit included in this data indicates whether at least one of selected memory cells MCI, MCO is in an ON state, or whether both of the selected memory cells MCI, MCO are in an OFF state.

In step S304, a result of the both-side EP verify operation is judged. For example, the number of data items indicating ON state (the number of data items indicating at least one of the selected memory cells MCI, MCO being in an ON state), among data items indicating ON state/OFF state of the memory cells MCI, MCO is acquired with reference to an unillustrated counter circuit. Moreover, in such cases as when the number of data items indicating ON state is a certain number or more, there is judged to have been verify FAIL, and processing proceeds to step S305. On the other hand, in such cases as when the number of data items indicating ON state is less than the certain number, there is judged to have been verify PASS, and processing proceeds to step S307.

In step S305, it is judged whether the loop count $n_{EP}$ has reached a predetermined count NEE), or not. When the loop count $n_{EP}$ has not reached the predetermined count $N_{EP}$, processing proceeds to step S306. When the loop count $n_{EP}$ has reached the predetermined count NEE, processing proceeds to step S308.

In step S306, 1 is added to the loop count $n_{EP}$, whereupon processing proceeds to step S302. Moreover, in step S306, for example, a certain voltage $\Delta V$ is added to the program voltage $V_{PGMEP}$. Hence, the program voltage $V_{PGMEP}$ increases along with increase in the loop count $n_{EP}$.

In step S307, status data to the effect that the both-side EP write operation ended normally is stored in an unillustrated status register, and the both-side EP write operation ends.

In step S308, status data to the effect that the both-side EP write operation did not end normally is stored in the unillustrated status register, and the both-side EP write operation ends.

[Both-Side EP Program Operation]

Figure 19:
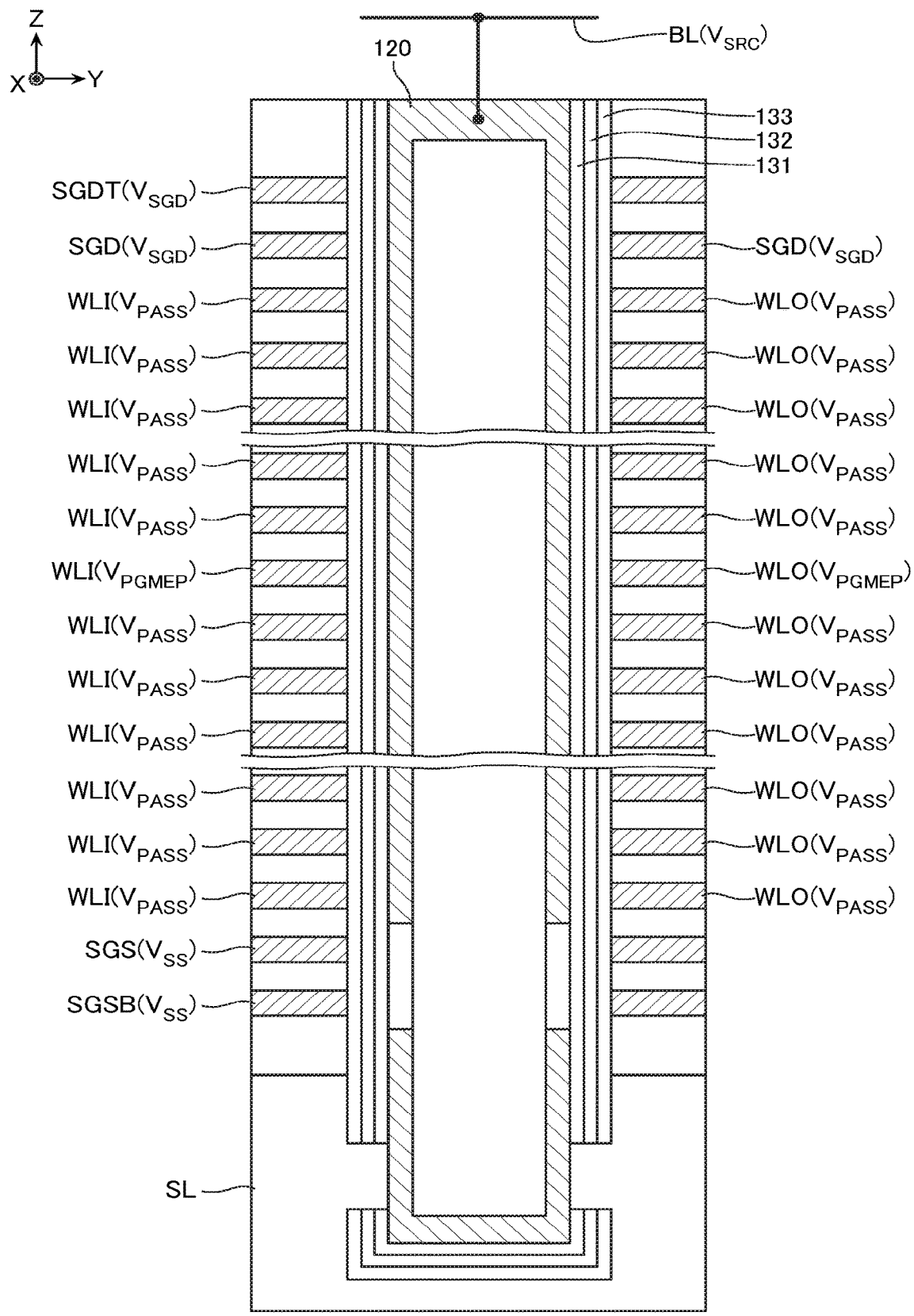
FIG. 19 is a schematic cross-sectional view for explaining a both-side EP program operation.

FIG. 19 is a schematic cross-sectional view for explaining the both-side EP program operation.

The both-side EP program operation is basically executed similarly to the program operation.

However, in the both-side EP program operation, the drain side select gate lines SGD corresponding to both of the memory strings MSI, MSO are applied with the voltage $V_{SGD}$.

Moreover, in the both-side EP program operation, the selected word lines WLI, WLO are applied with the program voltage $V_{PGMEP}$. The program voltage $V_{PGMEP}$ is larger than the write pass voltage $V_{PASS}$.

[Both-Side EP Verify Operation]

Figure 20:
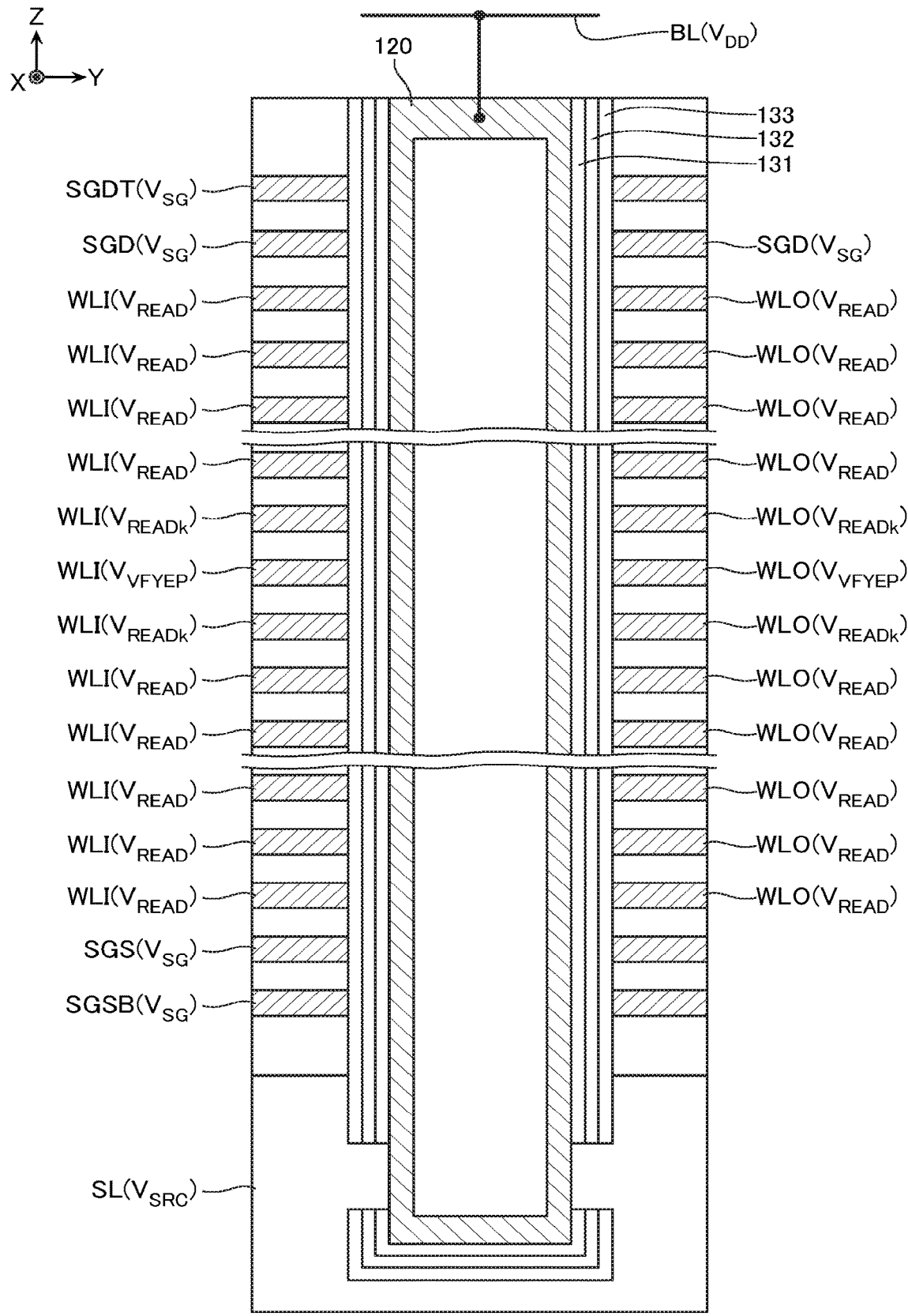
FIG. 20 is a schematic cross-sectional view for explaining a both-side EP verify operation.

FIG. 20 is a schematic cross-sectional view for explaining the both-side EP verify operation.

The both-side EP verify operation is basically executed similarly to the read operation.

However, in the both-side EP verify operation, the drain side select gate lines SGD corresponding to both of the memory strings MSI, MSO are applied with the voltage $V_{SG}$.

Moreover, in the both-side EP verify operation, the selected word lines WLI, WLO are applied with an EP verify voltage $V_{VFYEP}$.

[Single-Side EP Write Operation]

As has been described with reference to FIG. 15, in the erase verify operation, both of the word lines WLI, WLO are applied with the erase verify voltage $V_{VFYEr}$. In such a method, when either one of the memory cells MCI, MCO attains an ON state at each height position, a current flows in the bit line BL. As a result, there is judged to have been a verify PASS in step S204 of FIG. 13.

Figure 21:
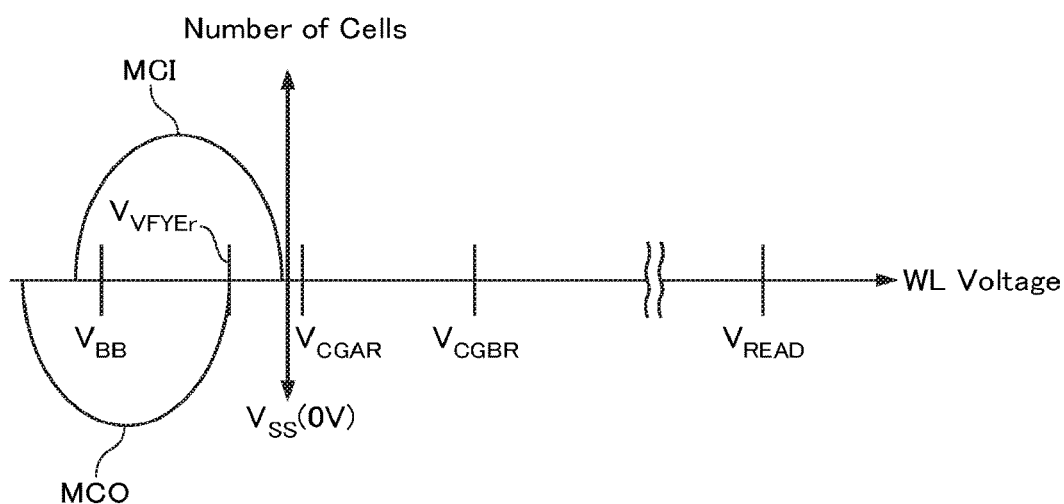
FIG. 21 is a schematic histogram for explaining a single-side EP write operation.

In such a method, threshold voltages of the memory cells MCI, MCO simultaneously decrease. Hence, when there is a difference in threshold distributions between the memory cells MCI, MCO before start of the erase operation, sometimes, at a timepoint when the erase operation has ended, positions of the threshold distributions of the memory cells MCI, MCO deviate from each other, as shown in FIG. 21, for example. For example, in the example of FIG. 21, the threshold voltage corresponding to a peak position of the threshold distribution of the memory cell MCI is larger than the threshold voltage corresponding to a peak position of the threshold distribution of the memory cell MCO. Hereafter, this kind of state will sometimes be expressed as the likes of the threshold distribution of the memory cell MCI being shallower, or the threshold distribution of the memory cell MCO being deeper.

Figure 22:
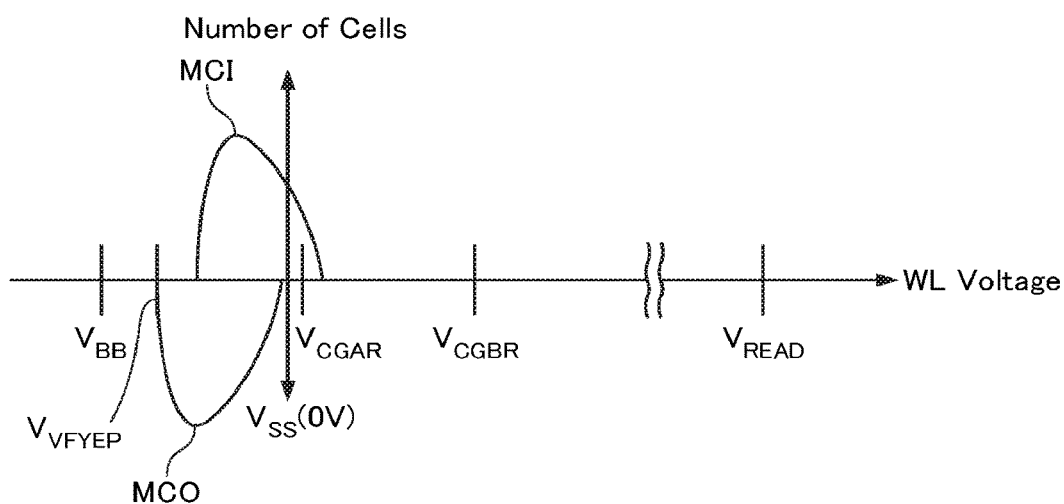
FIG. 22 is a schematic histogram for explaining the single-side EP write operation.

Now, when the both-side EP write operation is executed, threshold voltages of both the memory cells MCI, MCO simultaneously increase. Moreover, in the example illustrated, the threshold distribution of the memory cell MCO is comparatively deep, hence in order for a lower skirt of the threshold distribution corresponding to the memory cell MCO to be increased to a level of the EP verify voltage $V_{VFYEP}$, the word lines WLI, WLO get applied with a comparatively large program voltage $V_{PGMEP}$. Accordingly, an upper skirt of the threshold distribution corresponding to the memory cell MCI, too, comparatively greatly increases. As shown in FIG. 22, for example, when the upper skirt of the threshold distribution corresponding to the memory cell MCI exceeds the read voltage $V_{CGAR}$, a misread occurs.

Figure 23:
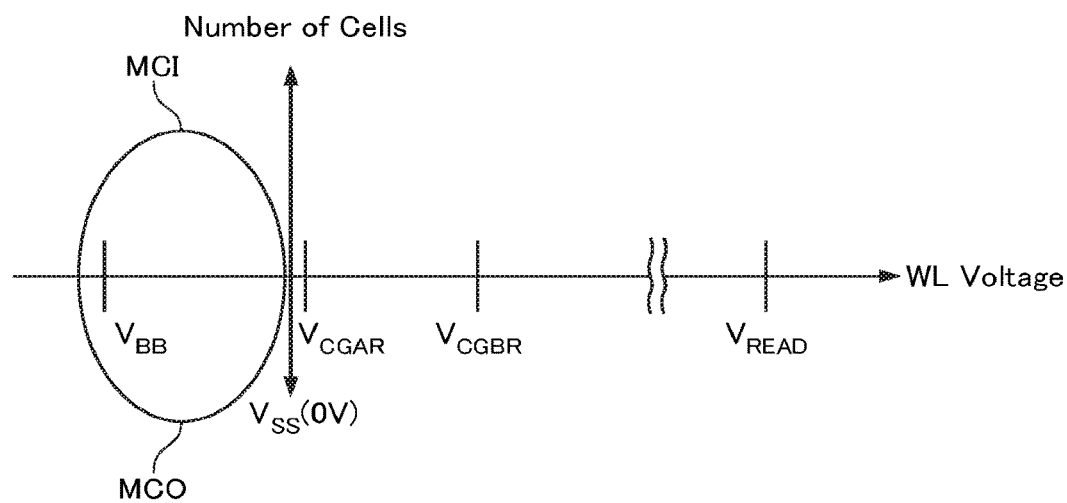
FIG. 23 is a schematic histogram for explaining the single-side EP write operation.
Figure 24:
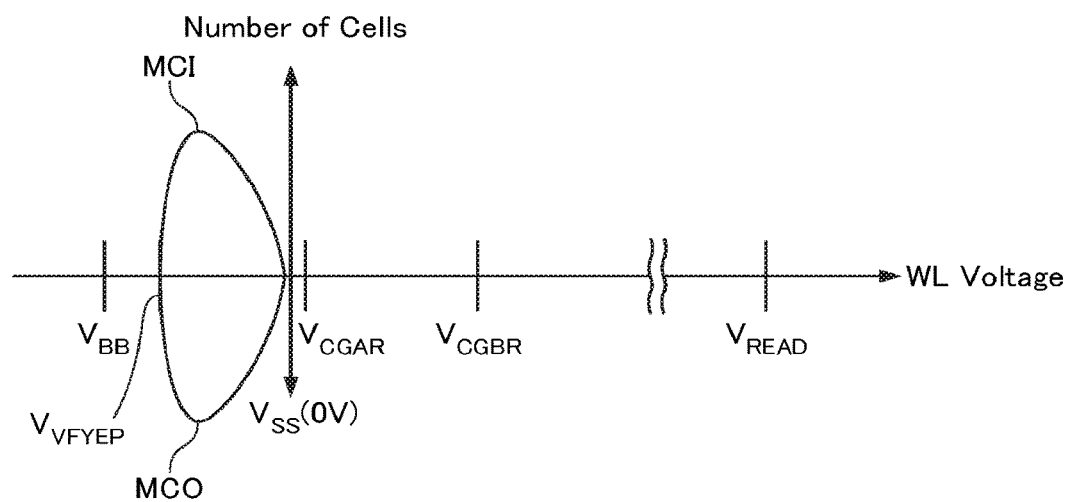
FIG. 24 is a schematic histogram for explaining the single-side EP write operation.

Accordingly, in the semiconductor memory device according to the present embodiment, after the erase operation has been executed and before the both-side EP write operation is executed, a memory block BLK that has undergone execution of the erase operation undergoes execution of a single-side EP write operation. This enables the threshold distributions of the memory cells MCI, MCO to be brought close to each other, as shown in FIG. 23, for example. As a result, the program voltage $V_{PGMEP}$ to be applied to the word lines WLI, WLO in the both-side EP write operation can be made comparatively small. Hence, as shown in FIG. 24, increase in the upper skirt of the threshold distribution of the memory cell MCI in the both-side EP write operation can be suppressed, and generation of misreads thereby suppressed.

Figure 25:
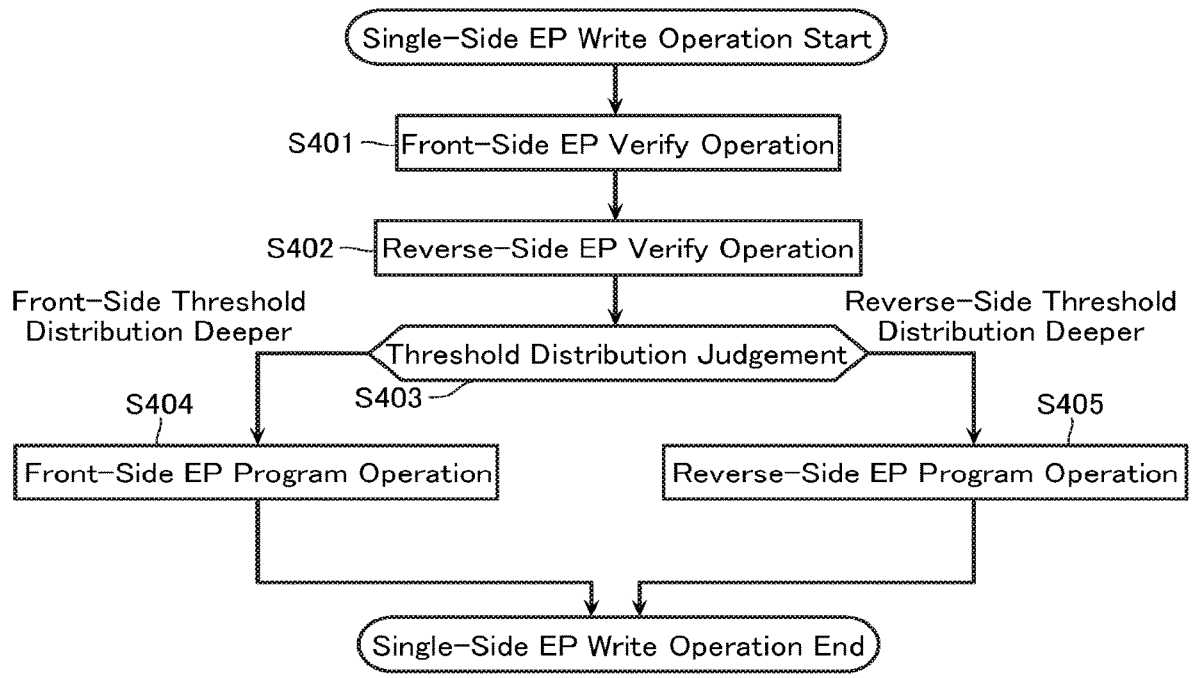
FIG. 25 is a schematic flowchart for explaining the single-side EP write operation.

FIG. 25 is a schematic flowchart for explaining the single-side EP write operation according to the present embodiment.

Note that in the present specification, an operation in which a selected word line WLI is applied with the program voltage $V_{PGMEP}$ will be referred to as a "front-side EP program operation", an operation in which a selected word line WLO is applied with the program voltage $V_{PGMEP}$ will be referred to as a "reverse-side EP program operation, and an operation in which the front-side EP program operation or reverse-side EP program operation and a front-side EP verify operation and reverse-side EP verify operation are executed at least one time each will be referred to as a "single-side EP write operation". For example, in the example of FIG. 25, the operation represented by the flowchart overall is a "single-side EP write operation", the operation of step S404 within the single-side EP write operation is a "front-side EP program operation", and the operation of step S405 within the single-side EP write operation is a "reverse-side EP program operation".

The single-side EP write operation is sequentially executed on the plurality of word lines WLI, WLO arranged in the Z direction.

In step S401, the front-side EP verify operation is executed. The front-side EP verify operation is an operation in which the selected word line WLI is applied with the EP verify voltage $V_{VFYEP}$, whereby a state of threshold distribution of the memory cells MCI is estimated.

In step S402, the reverse-side EP verify operation is executed. The reverse-side EP verify operation is an operation in which the selected word line WLO is applied with the EP verify voltage $V_{VFYEP}$, whereby a state of threshold distribution of the memory cells MCO is estimated.

In step S403, a threshold distribution judgement operation is executed. The threshold distribution judgement operation is an operation in which, by the states of threshold distributions of the memory cells MCI, MCO estimated in steps S401, S402 being compared, and data indicating a magnitude relationship of the threshold distributions acquired, it is judged which of the threshold distributions is deeper. When, in step S403, the threshold distribution of the memory cells MCI has been judged to be deeper, processing proceeds to step S404. On the other hand, when, in step S403, the threshold distribution of the memory cells MCO has been judged to be deeper, processing proceeds to step S405.

In step S404, the front-side EP program operation is executed. The front-side EP program operation is an operation in which the selected word line WLI is applied with the program voltage $V_{PGMEP}$, and the threshold voltage of the memory cell MCI thereby caused to increase.

In step S405, the reverse-side EP program operation is executed. The reverse-side EP program operation is an operation in which the selected word line WLO is applied with the program voltage $V_{PGMEP}$, and the threshold voltage of the memory cell MCO thereby caused to increase.

[Judgement of Threshold Distribution]

Figure 26:
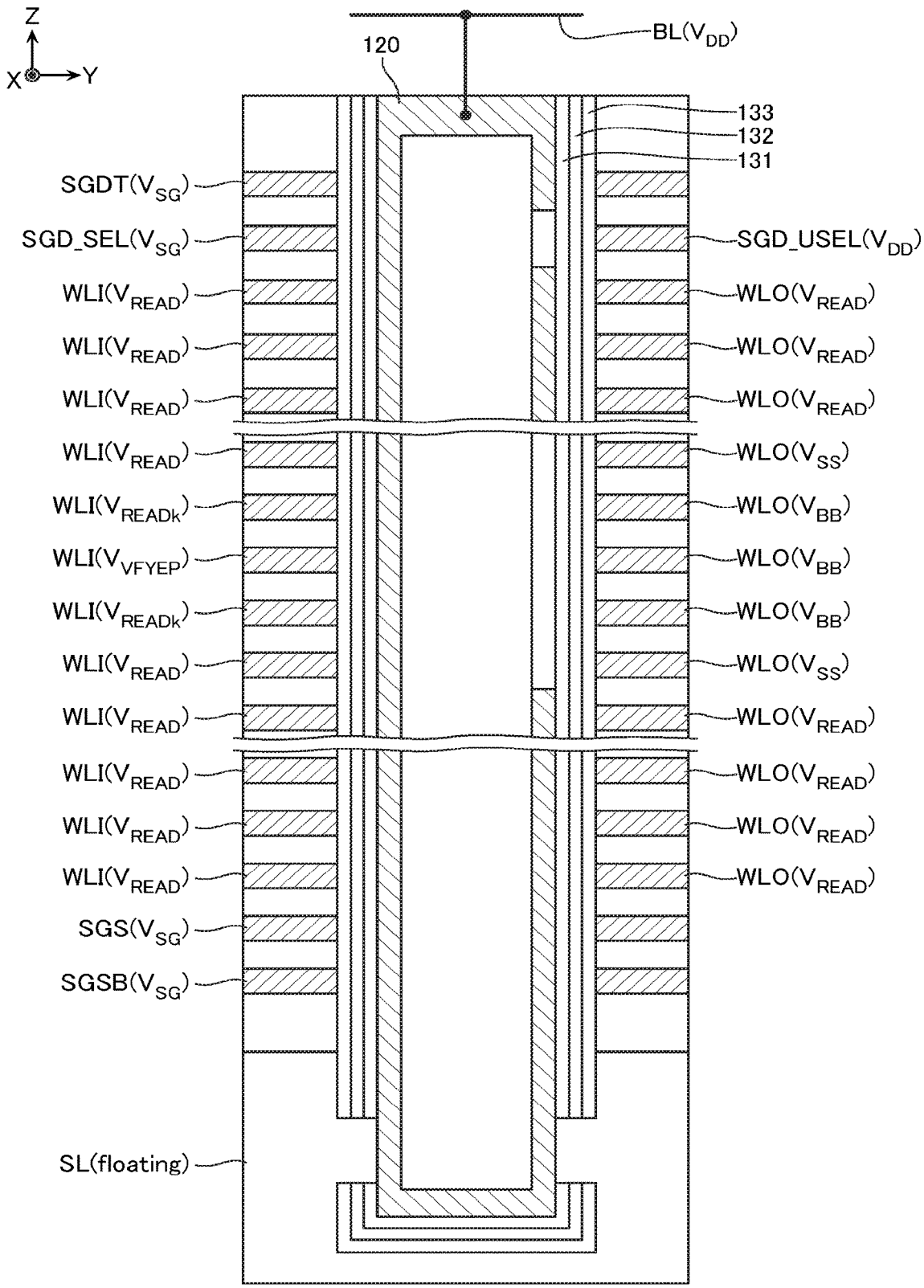
FIG. 26 is a schematic cross-sectional view for explaining a front-side EP verify operation.

FIG. 26 is a schematic cross-sectional view for explaining the front-side EP verify operation.

The front-side EP verify operation is basically executed similarly to the read operation.

However, in the front-side EP verify operation, the selected word line WLI is applied not with the read voltage $V_{CGRV}$, but with the EP verify voltage $V_{VFYEP}$.

Moreover, in the front-side EP verify operation, for example, the source line SL is electrically isolated from the voltage supply line, and thereby set to a floating state. Moreover, as will be mentioned later with reference to FIG. 28, the source line SL is made electrically continuous with the node N2 of the current comparing circuit.

The reverse-side EP verify operation is basically executed similarly to the front-side EP verify operation.

However, the voltage applied to the word line WLI in the front-side EP verify operation is applied to the word line WLO in the reverse-side EP verify operation. Moreover, the voltage applied to the word line WLO in the front-side EP verify operation is applied to the word line WLI in the reverse-side EP verify operation.

Figure 29:
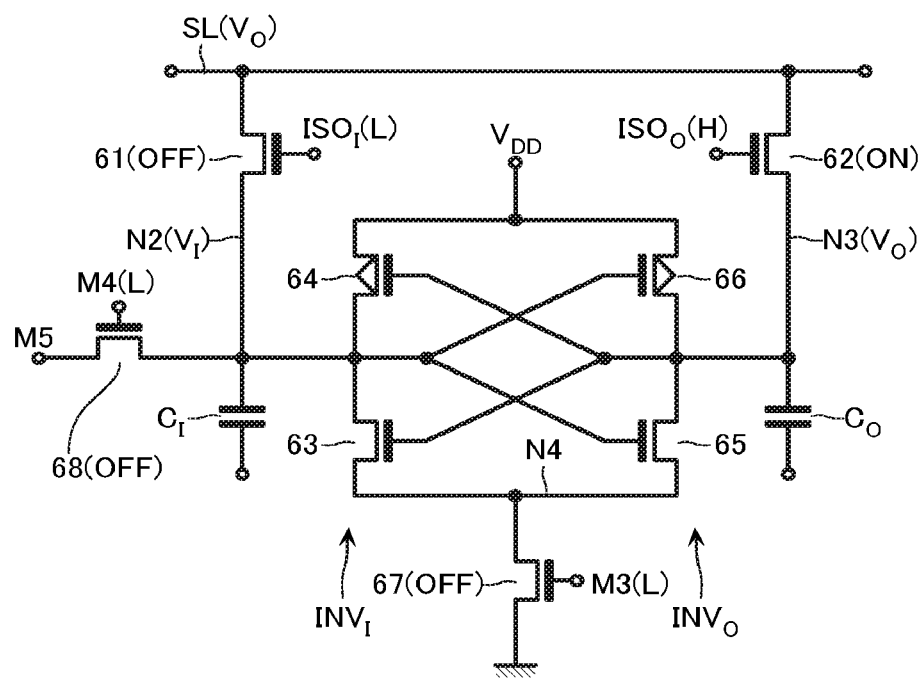
FIG. 29 is a schematic equivalent circuit diagram for explaining a part of the single-side EP write operation.

Moreover, in the reverse-side EP verify operation, as will be mentioned later with reference to FIG. 29, the source line SL is made electrically continuous not with the node N2 of the current comparing circuit, but with the node N3 of the current comparing circuit.

Figure 27:
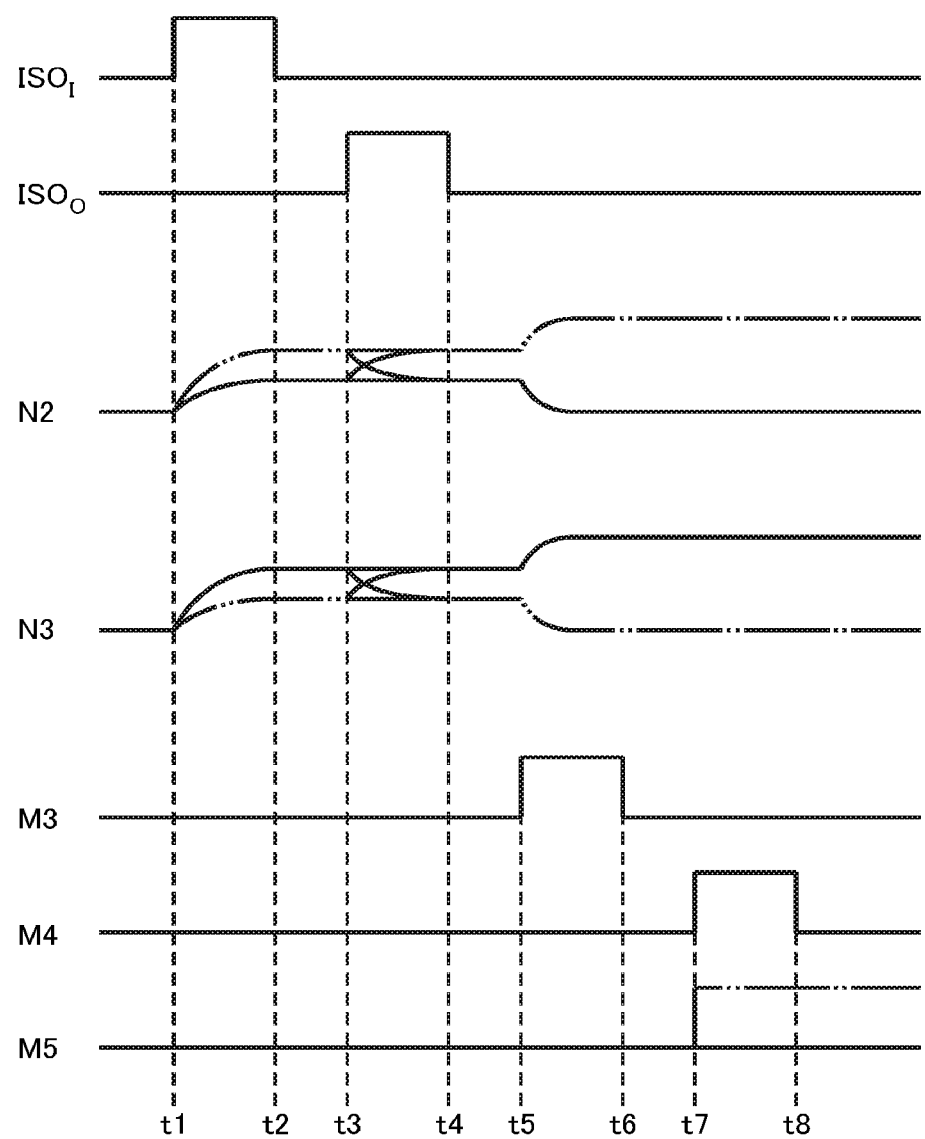
FIG. 27 is a schematic waveform chart for explaining a part of the single-side EP write operation.

FIG. 27 is a schematic waveform chart for explaining part of the single-side EP write operation. FIGS. 28 to 31 are schematic equivalent circuit diagrams for explaining part of the single-side EP write operation.

Figure 28:
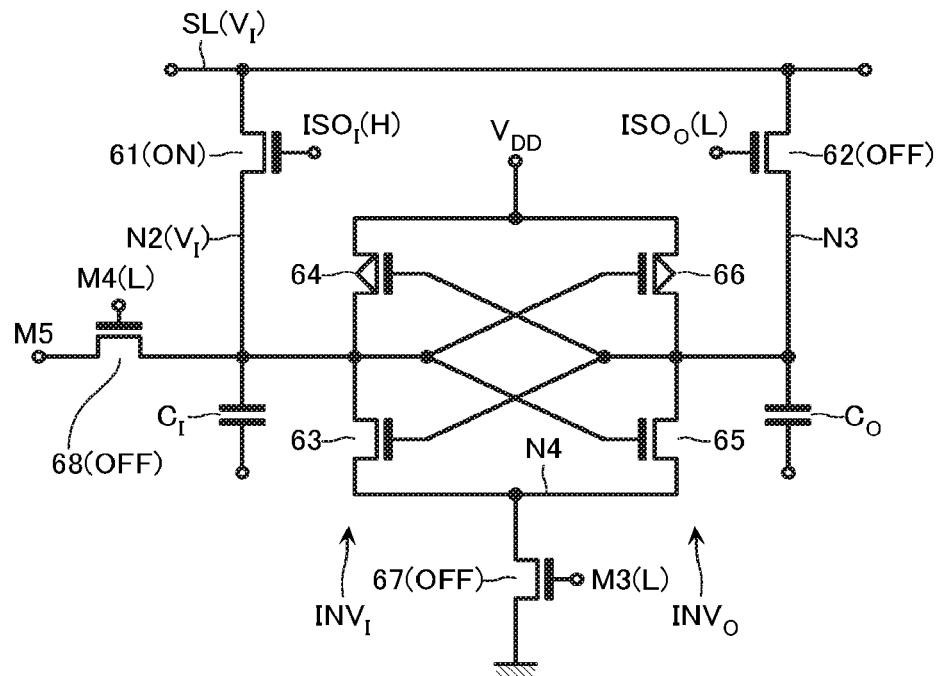
FIG. 28 is a schematic equivalent circuit diagram for explaining a part of the single-side EP write operation.

At timing t1 in FIG. 27, the front-side EP verify operation is started. At timing t1, as shown in FIG. 28, the signal line $ISO_I$ attains an "H" state, and the switch transistor 61 attains an ON state. As a result, the bit line BL is electrically continuous with the node N2 of the current comparing circuit, via the source line SL. In addition, the capacitor $C_T$ is charged. Regarding charging speed of the capacitor $C_T$, the larger the number of selected memory cells MCI in an ON state there are in the selected page portion, the higher the speed at which the capacitor $C_I$ is charged. In the example illustrated, the node N2 is charged to a voltage $V_I$.

At timing t2 in FIG. 27, the front-side EP verify operation ends. At timing t2, the signal line $ISO_I$ attains an "L" state, and the switch transistor 61 attains an OFF state.

At timing t3 in FIG. 27, the reverse-side EP verify operation is started. At timing t3, as shown in FIG. 29, the signal line $ISO_O$ attains an "H" state, and the switch transistor 62 attains an ON state. As a result, the bit line BL is electrically continuous with the node N3 of the current comparing circuit, via the source line SL. In addition, the capacitor $C_O$ is charged. Regarding charging speed of the capacitor $C_O$, the larger the number of selected memory cells MCO in an ON state there are in the selected page portion, the higher the speed at which the capacitor $C_O$ is charged. In the example illustrated, the node N3 is charged to a voltage $V_O$.

At timing t4 in FIG. 27, the reverse-side EP verify operation ends. At timing t4, the signal line $ISO_O$ attains an "L" state, and the switch transistor 62 attains an OFF state.

Note that time from timing t3 to timing t4 is identical to time from timing t1 to timing t2.

Figure 30:
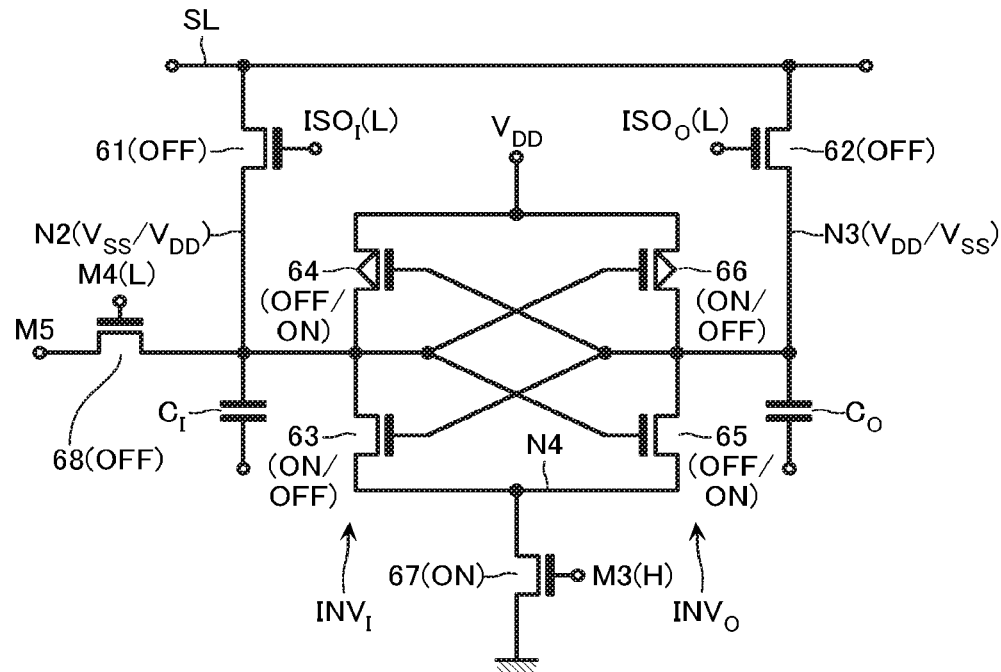
FIG. 30 is a schematic equivalent circuit diagram for explaining a part of the single-side EP write operation.

At timing t5 in FIG. 27, as shown in FIG. 30, the signal line M3 attains an "H" state, and the switch transistor 67 attains an ON state. Now, when the voltage $V_I$ of node N2 at timing t5 is smaller than the voltage $V_O$ of node N3 at timing t5, the node N2 is applied with the ground voltage $V_{SS}$, and the node N3 is applied with the voltage $V_{DD}$. On the other hand, when the voltage $V_I$ of node N2 is larger than the voltage $V_O$ of node N3, the node N2 is applied with the voltage $V_{DD}$, and the node N3 is applied with the ground voltage $V_{SS}$.

At timing t6 in FIG. 27, the signal line M3 attains an "L" state, and the switch transistor 67 attains an OFF state.

Figure 31:
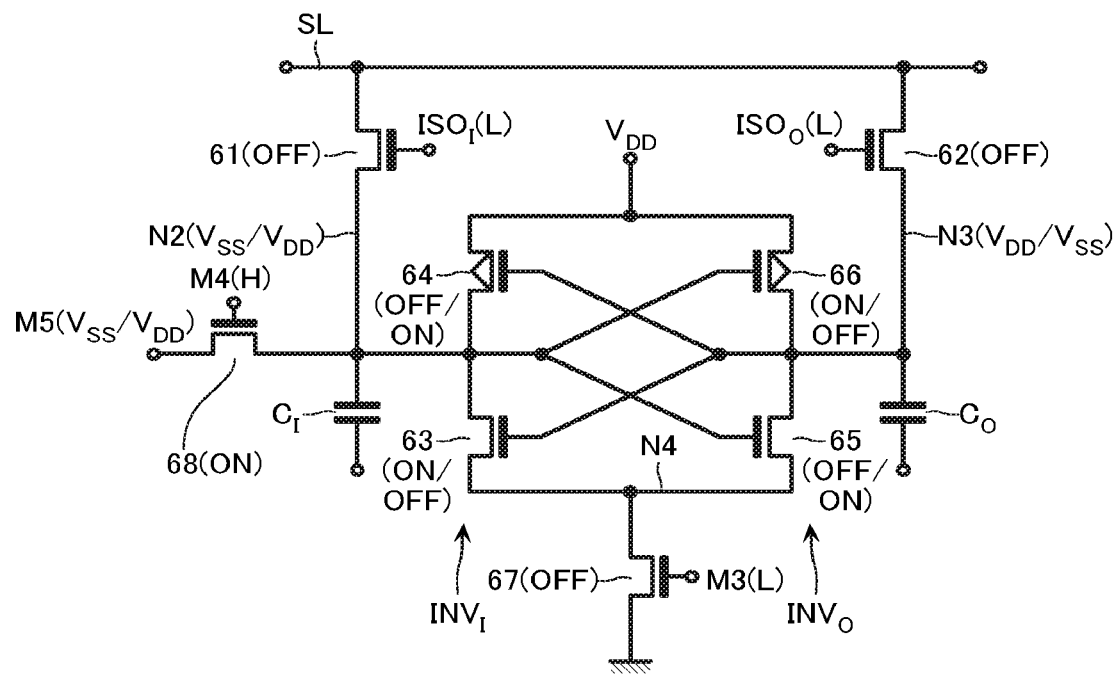
FIG. 31 is a schematic equivalent circuit diagram for explaining a part of the single-side EP write operation.

At timing t7 in FIG. 27, as shown in FIG. 31, the signal line M4 attains an "H" state, and the switch transistor 68 attains an ON state. As a result, the node N2 is electrically continuous with the signal line M5. At this time, voltage of the signal line M5 is outputted as data indicating the magnitude relationship of the threshold distributions.

At timing t8 in FIG. 27, the signal line M4 attains an "L" state, and the switch transistor 68 attains an OFF state.

Now, when threshold distribution on the front side is deeper, current flowing into the source line SL from the bit line BL during timings t1-t2 is larger than current flowing into the source line SL from the bit line BL during timings t3-t4. Hence, the above-described voltage $V_I$ is larger than the above-described voltage $V_O$. Hence, when, at timing t8, the voltage $V_{DD}$ has been applied to the signal line M5, in step S403 described with reference to FIG. 25, the threshold distribution on the front side is judged to be deeper.

On the other hand, when threshold distribution on the reverse side is deeper, current flowing into the source line SL from the bit line BL during timings t1-t2 is smaller than current flowing into the source line SL from the bit line BL during timings t3-t4. Hence, the above-described voltage $V_I$ is smaller than the above-described voltage $V_O$. Hence, when, at timing t8, the ground voltage $V_{SS}$ has been applied to the signal line M5, in step S403 described with reference to FIG. 25, the threshold distribution on the reverse side is judged to be deeper.

Note that in the example of FIG. 27, during timings t5-t6, the signal line M3 is in an "H" state, and voltage difference between the nodes N2, N3 is amplified. Moreover, voltages of the nodes N2, N3 decrease to the ground voltage $V_{SS}$, or increase to the voltage $V_{DD}$. However, it is possible too for voltage difference between the nodes N2, N3 to be not amplified, or for voltage difference between the nodes N2, N3 to be amplified to a degree that voltages of the nodes N2, N3 remain unsaturated. This makes it possible for data indicating the difference in threshold distributions between the memory cells MCI, MCO to be acquired based on the voltage of the signal line M5.

[Front-Side EP Program Operation and Reverse-Side EP Program Operation]

Figure 32:
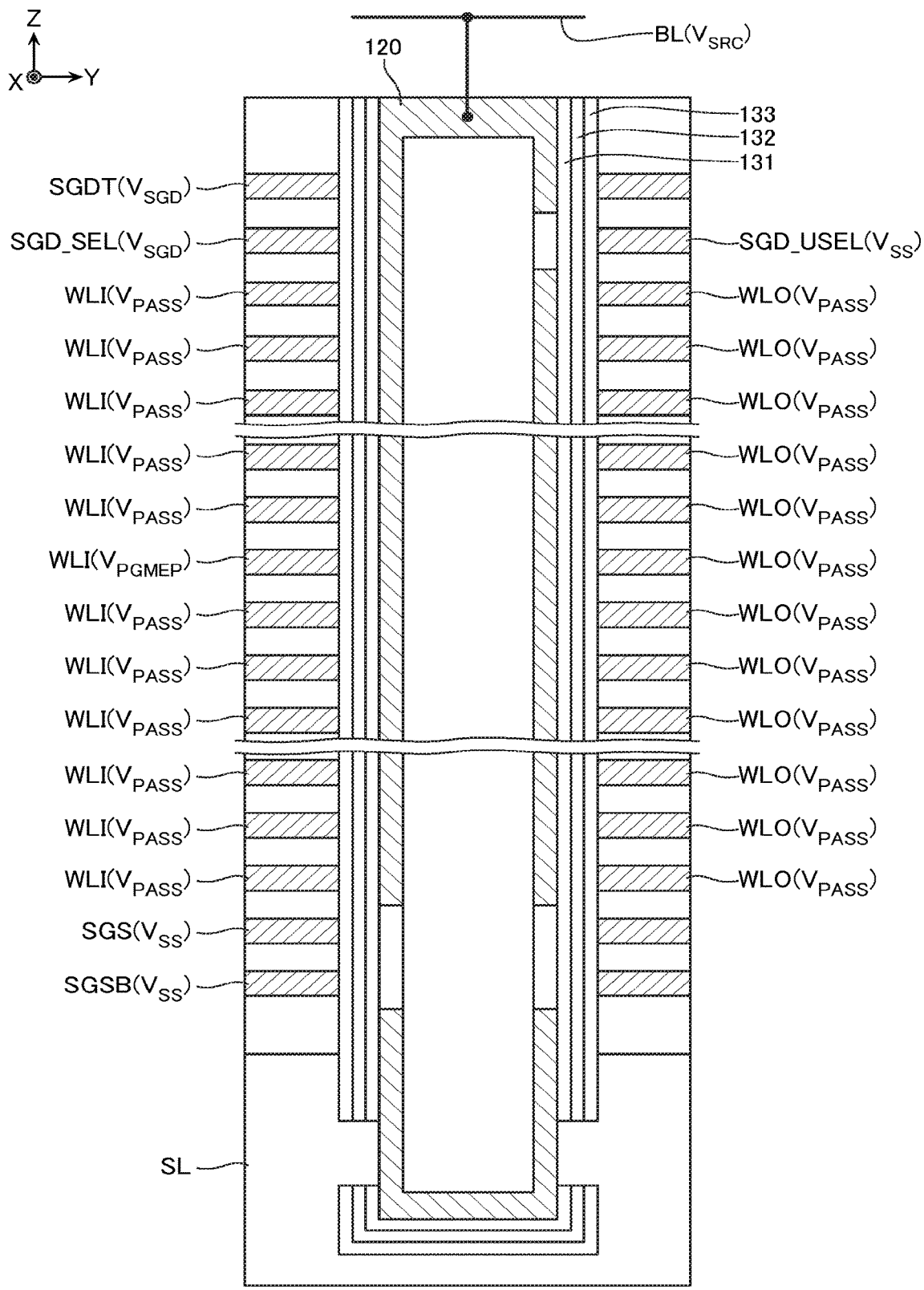
FIG. 32 is a schematic cross-sectional view for explaining a front-side EP program operation.

FIG. 32 is a schematic cross-sectional view for explaining the front-side EP program operation.

The front-side EP program operation is basically executed similarly to the both-side EP program operation described with reference to FIG. 19.

However, in the front-side EP program operation, the drain side select gate line SGD corresponding to the memory string MSI is applied with the voltage $V_{SGD}$, and the drain side select gate line SGD corresponding to the memory string MSO is applied with the ground voltage $V_{SS}$.

Moreover, in the front-side EP program operation, the program voltage $V_{PGMEP}$ is applied to the selected word line WLI, and the unselected word lines WLI and the word lines WLO are applied with the write pass voltage $V_{PASS}$.

Note that magnitude and supply time (pulse width) of the program voltage $V_{PGMEP}$ and voltage of the bit line BL are adjustable based on the data indicating the difference in threshold distributions between the memory cells MCI, MCO. For example, in the case of the difference in threshold distributions between the memory cells MCI, MCO being comparatively large, the program voltage $V_{PGMEP}$ is conceivably set to a comparatively large value or applied for a comparatively long time. Moreover, the voltage of the bit line BL is conceivably set to a comparatively small value or applied for a comparatively long time. On the other hand, in the case of the difference in threshold distributions between the memory cells MCI, MCO being comparatively small, the program voltage $V_{PGMEP}$ is conceivably set to a comparatively small value or applied for a comparatively short time. Moreover, the voltage of the bit line BL is conceivably set to a comparatively large value or applied for a comparatively short time.

The reverse-side EP program operation is basically executed similarly to the front-side EP program operation.

However, the voltage applied to the word line WLI in the front-side EP program operation is applied to the word line WLO in the reverse-side EP program operation. Moreover, the voltage applied to the word line WLO in the front-side EP program operation is applied to the word line WLI in the reverse-side EP program operation.

Second Embodiment

Next, a semiconductor memory device according to a second embodiment will be described.

The semiconductor memory device according to the second embodiment is basically configured similarly to the semiconductor memory device according to the first embodiment. However, in the semiconductor memory device according to the second embodiment, the current comparing circuit described with reference to FIG. 4 is connected not to the source line SL, but to the bit line BL. Moreover, a plurality of the current comparing circuits are provided correspondingly to each of the bit lines BL.

Figure 33:
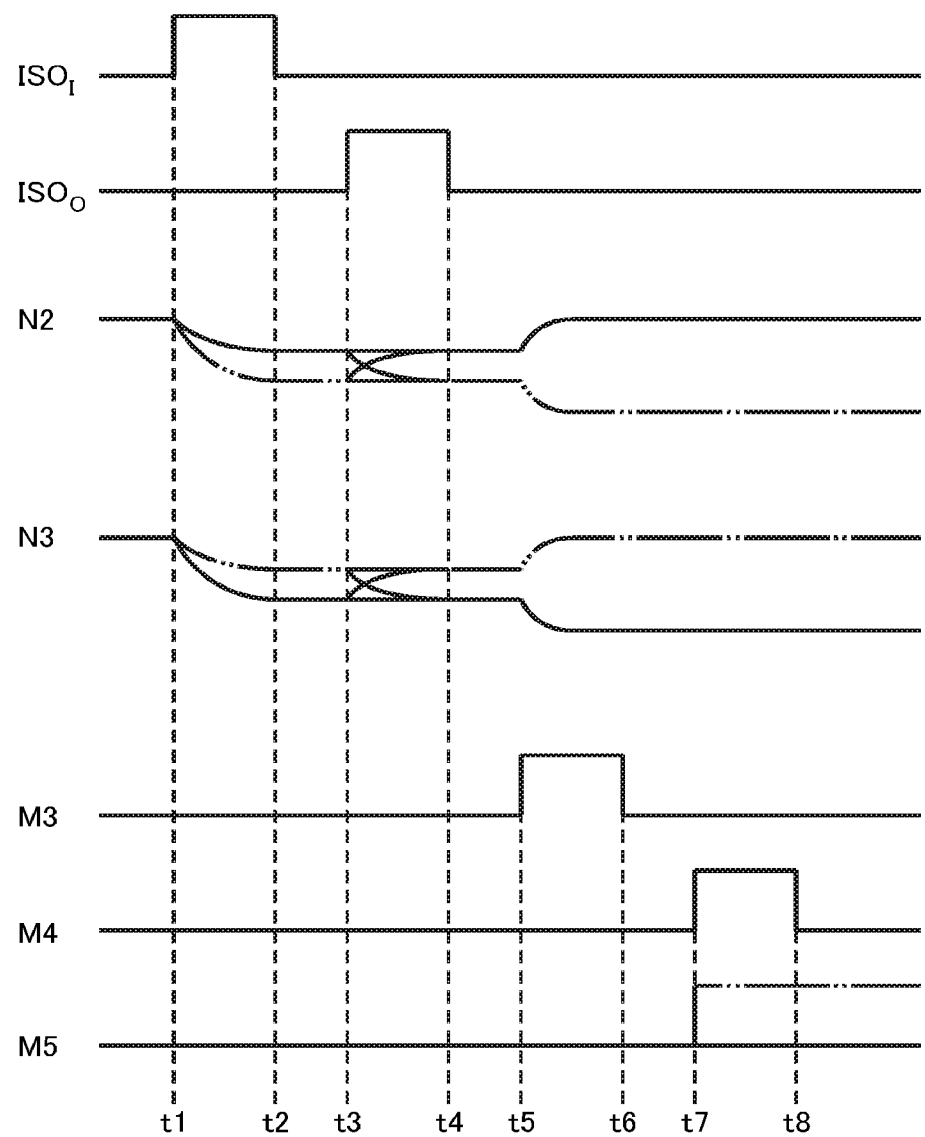
FIG. 33 is a schematic waveform chart for explaining a part of a single-side EP write operation according to a second embodiment.

Moreover, the semiconductor memory device according to the second embodiment basically operates similarly to the semiconductor memory device according to the first embodiment. However, a single-side EP write operation according to the second embodiment differs from the single-side EP write operation according to the first embodiment. FIG. 33 is a schematic waveform chart for explaining part of the single-side EP write operation according to the second embodiment.

As has been described with reference to FIG. 27, in the single-side EP write operation according to the first embodiment, charges of the capacitors $C_I$, $C_O$ are priorly discharged. Moreover, the capacitor $C_I$ is charged during timings t1-t2, and the capacitor $C_O$ is charged during timings t3-t4.

On the other hand, as shown in FIG. 33, in the single-side EP write operation according to the second embodiment, the capacitors $C_I$, $C_O$ are priorly charged. Moreover, charge of the capacitor $C_I$ is discharged during timings t1-t2, and charge of the capacitor $C_O$ is discharged during timings t3-t4.

Note that regarding discharging speed of charge of the capacitor $C_I$ during timings t1-t2, the smaller the threshold voltage of the selected memory cell MCI is, the higher the speed at which charge of the capacitor $C_I$ is discharged. Moreover, regarding discharging speed of charge of the capacitor $C_O$ during timings t3-t4, the smaller the threshold voltage of the selected memory cell MCO is, the higher the speed at which charge of the capacitor $C_O$ is discharged.

Moreover, in the single-side EP write operation according to the first embodiment, data indicating the magnitude relationship of the threshold distributions is acquired by the current comparing circuit. Moreover, when, at timing t8, the voltage $V_{DD}$ has been applied to the signal line M5, the threshold distribution on the front side is judged to be deeper. Moreover, when, at timing t8, the ground voltage $V_{SS}$ has been applied to the signal line M5, the threshold distribution on the reverse side is judged to be deeper.

On the other hand, in the single-side EP write operation according to the second embodiment, data indicating a magnitude relationship of threshold voltages of the memory cells MCI, MCO is acquired by the current comparing circuit. Moreover, when, at timing t8, the ground voltage $V_{SS}$ has been applied to the signal line M5 (when, at timing t8, the signal line M5 was in an "L" state), the threshold voltage of the memory cell MCI is judged to be smaller. Moreover, when, at timing t8, the voltage $V_{DD}$ has been applied to the signal line M5 (when, at timing t8, the signal line M5 was in an "H" state), the threshold voltage of the memory cell MCO is judged to be smaller.

Moreover, in step S403 of FIG. 25, the number of "L" state data items or number of "H" state data items among the data items indicating magnitude relationship of threshold voltages, is obtained with reference to an unillustrated counter circuit. Moreover, when the number of "L" state data items is greater, the threshold distribution on the front side is judged to be deeper. Moreover, when the number of "H" state data items is greater, the threshold distribution on the reverse side is judged to be deeper.

Moreover, in the second embodiment, due to a plurality of the current comparing circuits being provided correspondingly to each of the bit lines BL, it is possible for data indicating magnitude relationship of threshold voltages to be obtained for the memory cells MCI, MCO connected to each of the bit lines BL. Hence, in the case of the front-side EP program operation corresponding to step S404 of FIG. 25 being executed, it is possible for a memory cell MCI having a threshold voltage lower than the threshold voltage of the memory cell MCO, to have its threshold voltage increased. Similarly, in the case of the reverse-side EP program operation corresponding to step S405 of FIG. 25 being executed, it is possible for a memory cell MCO having a threshold voltage lower than the threshold voltage of the memory cell MCI, to have its threshold voltage increased.

For example, in the front-side EP program operation and reverse-side EP program operation according to the second embodiment, the bit lines BL connected to the memory cells MCI, MCO that are to have their threshold voltage increased are applied with the voltage $V_{SRC}$, and the bit lines BL connected to the memory cells MCI, MCO that are not to have their threshold voltage increased are applied with the voltage $V_{DD}$.

This kind of method is executable by having data of the signal line M5 or its inverted data latched in the latch circuit SDL, and setting states of the signal lines STB, XXL, BLC, BLS, HLL, BLX to "L, L, H, H, L, H", for example.

Moreover, in the front-side EP program operation according to the second embodiment, it is possible for a memory cell MCI having a threshold voltage lower than the threshold voltage of the memory cell MCO and the EP verify voltage $V_{VFYEP}$, to have its threshold voltage increased. Similarly, in the reverse-side EP program operation according to the second embodiment, it is possible for a memory cell MCO having a threshold voltage lower than the threshold voltage of the memory cell MCI and the EP verify voltage $V_{VFYEP}$, to have its threshold voltage increased.

In such a case, the both-side EP verify operation described with reference to FIG. 20 may be executed before execution of the front-side EP program operation and reverse-side EP program operation. As a result, it is possible for data indicating whether the threshold voltage of at least either one of the selected memory cells MCI, MCO is lower than the EP verify voltage $V_{VFYEP}$, or not, to be acquired. Hence, by combining this data and the above-described data indicating magnitude relationship of threshold voltages, it is possible for a memory cell MCI having a threshold voltage lower than the threshold voltage of the memory cell MCO and the EP verify voltage $V_{VFYEP}$, to be specified. Similarly, it is possible for a memory cell MCO having a threshold voltage lower than the threshold voltage of the memory cell MCI and the EP verify voltage $V_{VFYEP}$, to be specified.

Note that magnitude and supply time (pulse width) of voltage of the bit line BL are adjustable based on the data indicating difference in threshold voltages between the memory cells MCI, MCO. For example, in the case of difference in threshold voltages between the memory cells MCI, MCO being comparatively large, the voltage of the bit line BL is conceivably set to a comparatively small value or applied for a comparatively long time. On the other hand, in the case of difference in threshold voltages between the memory cells MCI, MCO being comparatively small, the voltage of the bit line BL is conceivably set to a comparatively large value or applied for a comparatively short time.

Note that it is possible for the data indicating difference in threshold voltages between the memory cells MCI, MCO to be acquired without voltage difference between the nodes N2, N3 being amplified during timings t5-t6 of FIG. 27, or by voltage difference between the nodes N2, N3 being amplified to a degree that voltages of the nodes N2, N3 remain unsaturated, during timings t5-t6 of FIG. 27.

Note that in other respects, the single-side EP write operation according to the second embodiment is executed similarly to the single-side EP write operation according to the first embodiment.

Third Embodiment

Next, a semiconductor memory device according to a third embodiment will be described.

The semiconductor memory device according to the third embodiment is basically configured similarly to the semiconductor memory device according to the second embodiment.

Moreover, the semiconductor memory device according to the third embodiment basically operates similarly to the semiconductor memory device according to the second embodiment. However, a single-side EP write operation according to the third embodiment differs from the single-side EP write operation according to the second embodiment.

Figure 34:
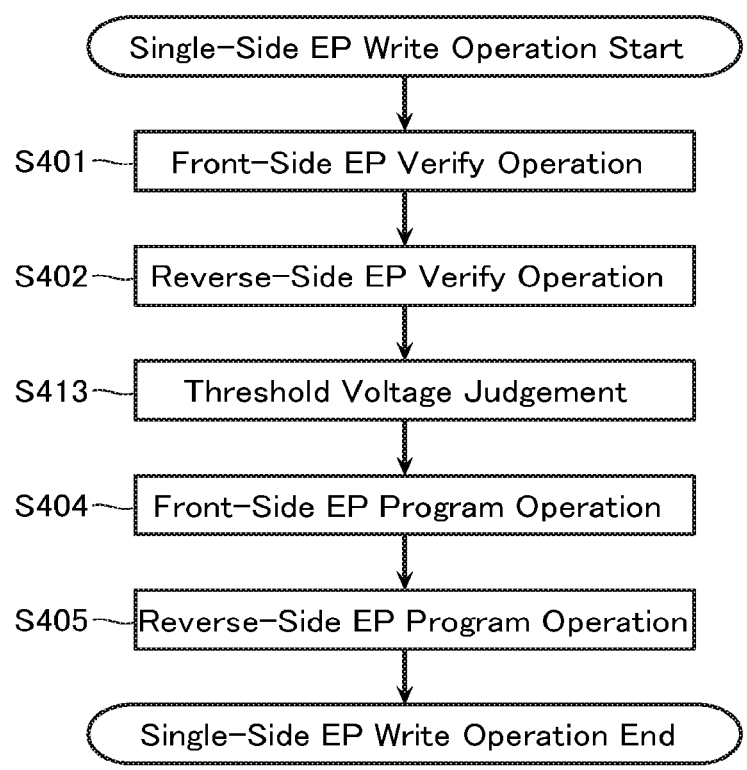
FIG. 34 is a schematic flowchart for explaining a single-side EP write operation according to a third embodiment.

FIG. 34 is a schematic flowchart for explaining the single-side EP write operation according to the third embodiment.

In the single-side EP write operation according to the third embodiment, a threshold voltage judgement operation is executed as step S413, instead of a threshold distribution judgement operation corresponding to step S404 of FIG. 25. The threshold voltage judgement operation is basically executed similarly to the threshold distribution judgement operation according to the second embodiment. However, in the threshold voltage judgement operation, there is performed acquisition of data indicating magnitude relationship of threshold voltages of the memory cells MCI, MCO, and there is not performed judgement of whether the threshold distribution on the front side is deeper or whether the threshold distribution on the reverse side is deeper.

Moreover, in the single-side EP write operation according to the second embodiment, as shown in FIG. 25, either one of the front-side EP program operation of step S404 and reverse-side EP program operation of step S405 is executed based on the result of the threshold distribution judgement operation of step S403. Moreover, in the front-side EP program operation and reverse-side EP program operation, threshold voltages of the memory cells MCI, MCO whose threshold voltages should be increased, are selectively increased.

On the other hand, in the single-side EP write operation according to the third embodiment, as shown in FIG. 34, both the front-side EP program operation of step S404 and the reverse-side EP program operation of step S405 are executed. The front-side EP program operation and reverse-side EP program operation according to the third embodiment are executed similarly to the front-side EP program operation and reverse-side EP program operation according to the second embodiment.

For example, in the third embodiment, threshold voltages of both a memory cell MCI having a threshold voltage lower than the threshold voltage of a memory cell MCO and a memory cell MCO having a threshold voltage lower than the threshold voltage of a memory cell MCI, may be increased.

Moreover, for example, in the third embodiment, threshold voltages of both a memory cell MCI having a threshold voltage lower than the threshold voltage of a memory cell MCO and EP verify voltage $V_{VFYEP}$ and a memory cell MCO having a threshold voltage lower than the threshold voltage of a memory cell MCI and EP verify voltage $V_{VFYEP}$, may be increased. In such a case, the both-side EP verify operation described with reference to FIG. may be executed before execution of the front-side EP program operation and reverse-side EP program operation.

Note that in other respects, the single-side EP write operation according to the third embodiment is executed similarly to the single-side EP write operation according to the second embodiment.

Fourth Embodiment

Next, a semiconductor memory device according to a fourth embodiment will be described.

The semiconductor memory device according to the fourth embodiment is basically configured similarly to the semiconductor memory device according to the first embodiment. However, the semiconductor memory device according to the fourth embodiment does not comprise the current comparing circuit described with reference to FIG. 4.

The semiconductor memory device according to the fourth embodiment basically operates similarly to the semiconductor memory device according to the first embodiment. However, a single-side EP write operation according to the fourth embodiment differs from the single-side EP write operation according to the first embodiment.

Figure 35:
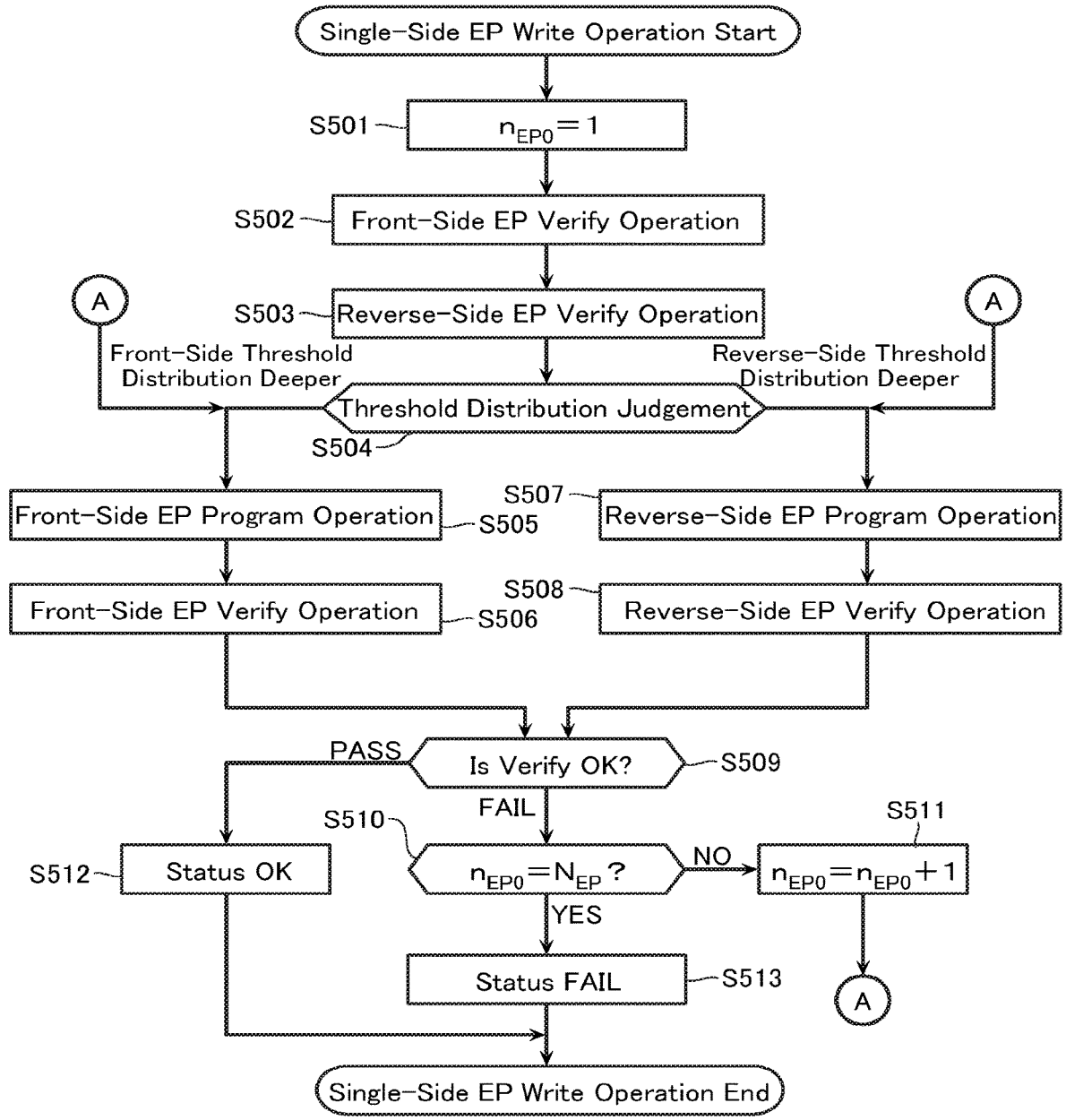
FIG. 35 is a schematic flowchart for explaining a single-side EP write operation according to a fourth embodiment.

FIG. 35 is a schematic flowchart for explaining the single-side EP write operation according to the fourth embodiment.

In step S501, a loop count $n_{EPO}$ is set to 1. The loop count $n_{EPO}$ is a variable indicating the number of times of a single-side EP write loop.

In step S502, a front-side EP verify operation is executed. The front-side EP verify operation according to the present embodiment is basically executed similarly to the read operation. However, in the front-side EP verify operation according to the present embodiment, the selected word line WLI is applied not with the read voltage $V_{CGRV}$, but with the EP verify voltage $V_{VFYEP}$.

In step S503, a reverse-side EP verify operation is executed. The reverse-side EP verify operation according to the present embodiment is basically executed similarly to the read operation. However, in the reverse-side EP verify operation according to the present embodiment, the selected word line WLO is applied not with the read voltage $V_{CGRV}$, but with the EP verify voltage $V_{VFYEP}$.

In step S504, for example, the number of selected memory cells MCI that have been judged to be in an ON state in step S502, is acquired. For example, the number of data items indicating ON state, of the data items indicating ON/OFF state of the selected memory cells MCI, that have been acquired in step S502, is acquired with reference to an unillustrated counter circuit.

Moreover, in step S504, for example, the number of selected memory cells MCO that have been judged to be in an ON state in step S503, is acquired. For example, the number of data items indicating ON state, of the data items indicating ON/OFF state of the selected memory cells MCO, that have been acquired in step S503, is acquired with reference to an unillustrated counter circuit.

Moreover, in step S504, a comparison is made of the number of selected memory cells MCI that have been judged to be in an ON state in step S502 and the number of selected memory cells MCO that have been judged to be in an ON state in step S503. When the former is greater, the threshold distribution of the memory cells MCI is judged to be deeper, and processing proceeds to step S505. When the latter is greater, the threshold distribution of the memory cells MCO is judged to be deeper, and processing proceeds to step S507.

In step S505, a front-side EP program operation is executed, whereupon processing proceeds to step S506. The front-side EP program operation of step S505 is executed similarly to the front-side EP program operation (refer to FIG. 32) corresponding to step S404 of FIG. 25, for example.

Note that in the front-side EP program operation of step S505, all of the bit lines BL may be applied with the voltage $V_{SRC}$, similarly to in the first embodiment, or a part of the bit lines BL may be applied with the voltage $V_{SRC}$ and the remainder of the bit lines BL applied with the voltage $V_{DD}$, similarly to in the second embodiment or third embodiment. In the case of a part of the bit lines BL being applied with the voltage $V_{SRC}$, for example, the bit lines BL connected to the selected memory cells MCI that have been judged to be in an ON state in the front-side EP verify operation corresponding to step S502 or step S506, may be applied with the voltage $V_{SRC}$, and the other bit lines BL applied with the voltage $V_{DD}$.

In step S506, a front-side EP verify operation is executed, whereupon processing proceeds to step S509. The front-side EP verify operation of step S506 is executed similarly to the front-side EP verify operation corresponding to step S502.

In step S507, a reverse-side EP program operation is executed, whereupon processing proceeds to step S508. The reverse-side EP program operation of step S507 is executed similarly to the reverse-side EP program operation corresponding to step S405 of FIG. 25, for example.

Note that in the reverse-side EP program operation of step S507, all of the bit lines BL may be applied with the voltage $V_{SRC}$, similarly to in the first embodiment, or a part of the bit lines BL may be applied with the voltage $V_{SRC}$ and the remainder of the bit lines BL applied with the voltage $V_{SRC}$, similarly to in the second embodiment or third embodiment. In the case of a part of the bit lines BL being applied with the voltage $V_{SRC}$, for example, the bit lines BL connected to the selected memory cells MCO that have been judged to be in an ON state in the reverse-side EP verify operation corresponding to step S503 or step S508, may be applied with the voltage $V_{SRC}$, and the other bit lines BL applied with the voltage $V_{DD}$.

In step S508, a reverse-side EP verify operation is executed, whereupon processing proceeds to step S509. The reverse-side EP verify operation of step S508 is executed similarly to the reverse-side EP verify operation corresponding to step S503.

In step S509, a result of the verify operation is judged.

When, for example, in step S504, the threshold distribution of the memory cells MCI is judged to be deeper, the number of selected memory cells MCI that have been judged to be in an ON state is acquired in step S506.

Moreover, a comparison is made of the number of selected memory cells MCI that have been judged to be in an ON state in step S506 and the number of selected memory cells MCO that have been judged to be in an ON state in step S503. In the case of the former being greater, there is judged to have been verify FAIL, and processing proceeds to step S510. In other cases, there is judged to have been verify PASS, and processing proceeds to step S512.

Moreover, when, for example, in step S504, the threshold distribution of the memory cells MCO is judged to be deeper, the number of selected memory cells MCO that have been judged to be in an ON state is acquired in step S508.

Moreover, a comparison is made of the number of selected memory cells MCO that have been judged to be in an ON state in step S508 and the number of selected memory cells MCI that have been judged to be in an ON state in step S502. In the case of the former being greater, there is judged to have been verify FAIL, and processing proceeds to step S510. In other cases, there is judged to have been verify PASS, and processing proceeds to step S512.

In step S510, it is judged whether the loop count $n_{EPO}$ has reached a predetermined count $N_{EPO}$, or not. When the loop count $n_{EPO}$ has not reached the predetermined count $N_{EPO}$, processing proceeds to step S511. When the loop count $n_{EPO}$ has reached the predetermined count $N_{EPO}$, processing proceeds to step S513.

In step S511, 1 is added to the loop count $n_{EPO}$. Moreover, in step S511, for example, a certain voltage $\Delta V$ is added to the program voltage $V_{PGMEP}$. Hence, the program voltage $V_{PGMEP}$ increases along with increase in the loop count $n_{EPO}$.

After execution of step S511, processing proceeds to step S505 or step S507. For example, in the case of threshold distribution of the memory cells MCI being judged to be deeper in step S504, processing proceeds to step S505. Moreover, in the case of threshold distribution of the memory cells MCO being judged to be deeper in step S504, processing proceeds to step S507.

In step S512, status data to the effect that the single-side EP write operation ended normally is stored in an unillustrated status register, and the single-side EP write operation ends.

In step S513, status data to the effect that the single-side EP write operation did not end normally is stored in the unillustrated status register, and the single-side EP write operation ends.

Fifth Embodiment

Next, a semiconductor memory device according to a fifth embodiment will be described.

The semiconductor memory device according to the fifth embodiment is basically configured similarly to the semiconductor memory device according to the fourth embodiment.

The semiconductor memory device according to the fifth embodiment basically operates similarly to the semiconductor memory device according to the fourth embodiment. However, a single-side EP write operation according to the fifth embodiment differs from the single-side EP write operation according to the fourth embodiment.

Figure 36:
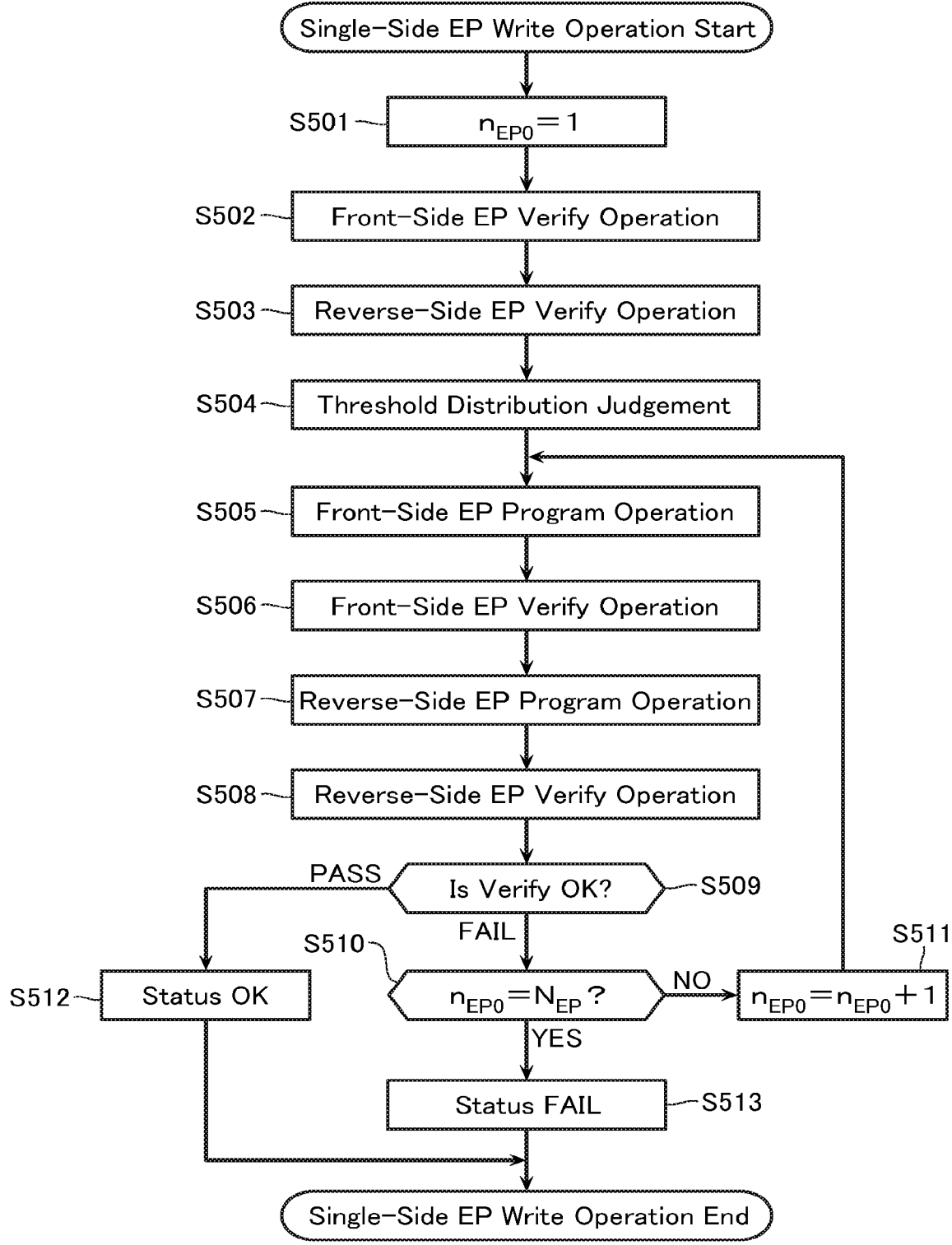
FIG. 36 is a schematic flowchart for explaining a single-side EP write operation according to a fifth embodiment.

FIG. 36 is a schematic flowchart for explaining the single-side EP write operation according to the fifth embodiment.

The single-side EP write operation according to the fifth embodiment is basically executed similarly to the single-side EP write operation according to the fourth embodiment.

However, in the single-side EP write operation according to the fifth embodiment, as shown in FIG. 36, the front-side EP program operation of step S505 and front-side EP verify operation of step S506, and the reverse-side EP program operation of step S507 and reverse-side EP verify operation of step S508, are all executed.

Moreover, in the front-side EP program operation and reverse-side EP program operation according to the fourth embodiment, all of the bit lines BL may be applied with the voltage $V_{SRC}$, similarly to in the first embodiment, or a part of the bit lines BL may be applied with the voltage $V_{SRC}$ and the remainder of the bit lines BL applied with the voltage $V_{DD}$, similarly to in the second embodiment or third embodiment.

On the other hand, in the front-side EP program operation and reverse-side EP program operation according to the fifth embodiment, a part of the bit lines BL are applied with the voltage $V_{SRC}$, and the remainder of the bit lines BL are applied with the voltage $V_{DD}$, similarly to in the second embodiment or third embodiment.

For example, in the front-side EP program operation, the bit lines BL connected to the selected memory cells MCI that have been judged to be in an ON state in the front-side EP verify operation corresponding to step S502 or step S506, are applied with the voltage $V_{SRC}$, and the other bit lines BL are applied with the voltage $V_{DD}$.

Moreover, for example, in the reverse-side EP program operation, the bit lines BL connected to the selected memory cells MCO that have been judged to be in an ON state in the reverse-side EP verify operation corresponding to step S503 or step S508, are applied with the voltage $V_{SRC}$, and the other bit lines BL are applied with the voltage $V_{DD}$.

Moreover, in the single-side EP write operation according to the fifth embodiment, processing proceeds to step S505 after execution of step S511, regardless of a judgement result in step S504.

Sixth Embodiment

Next, a semiconductor memory device according to a sixth embodiment will be described.

The single-side EP write operation according to the first embodiment adopts as operation target a pair of word lines WLI, WLO provided at the same height position. Hence, the single-side EP write operation according to the first embodiment is sequentially executed on all of the word lines WLI, WLO arranged in the Z direction.

However, such a method is merely an exemplification, and a specific method may be appropriately adjusted. For example, in the front-side EP program operation corresponding to step S404 of FIG. 25, all of the word lines WLI arranged in the Z direction may be applied with the program voltage $V_{PGMEP}$. Similarly, in the reverse-side EP program operation corresponding to step S405 of FIG. 25, all of the word lines WLO arranged in the Z direction may be applied with the program voltage $V_{PGMEP}$.

Figure 37:
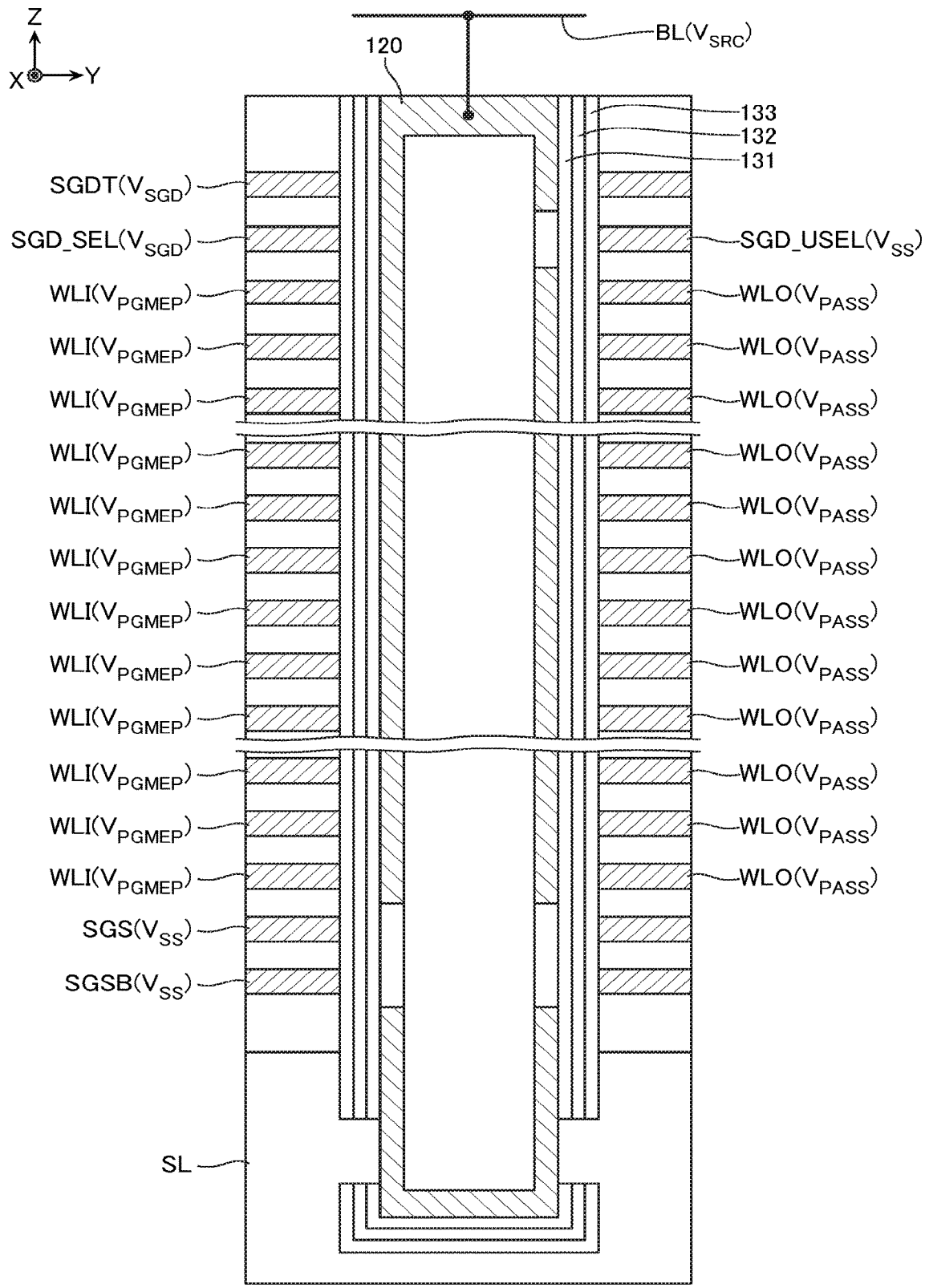
FIG. 37 is a schematic cross-sectional view for explaining a front-side EP program operation according to a sixth embodiment.

FIG. 37 is a schematic cross-sectional view for explaining a front-side EP program operation according to the sixth embodiment.

The front-side EP program operation according to the sixth embodiment is basically executed similarly to the front-side EP program operation described with reference to FIG. 32.

However, in the front-side EP program operation according to the sixth embodiment, as shown in FIG. 37, all of the word lines WLI arranged in the Z direction are applied with the program voltage $V_{PGMEP}$.

The reverse-side EP program operation according to the sixth embodiment is basically executed similarly to the front-side EP program operation.

However, the voltage applied to the word lines WLI in the front-side EP program operation is applied to the word lines WLO in the reverse-side EP program operation. Moreover, the voltage applied to the word lines WLO in the front-side EP program operation is applied to the word lines WLI in the reverse-side EP program operation.

Seventh Embodiment

Next, a semiconductor memory device according to a seventh embodiment will be described.

The semiconductor memory device according to the seventh embodiment is basically configured similarly to the semiconductor memory device according to the sixth embodiment.

Moreover, the semiconductor memory device according to the seventh embodiment basically operates similarly to the semiconductor memory device according to the sixth embodiment. However, a single-side EP write operation according to the seventh embodiment differs from the single-side EP write operation according to the sixth embodiment.

The single-side EP write operation according to the seventh embodiment is basically executed similarly to the single-side EP write operation according to the sixth embodiment. However, a front-side EP verify operation and reverse-side EP verify operation according to the seventh embodiment differ from the front-side EP verify operation and reverse-side EP verify operation according to the sixth embodiment.

Figure 38:
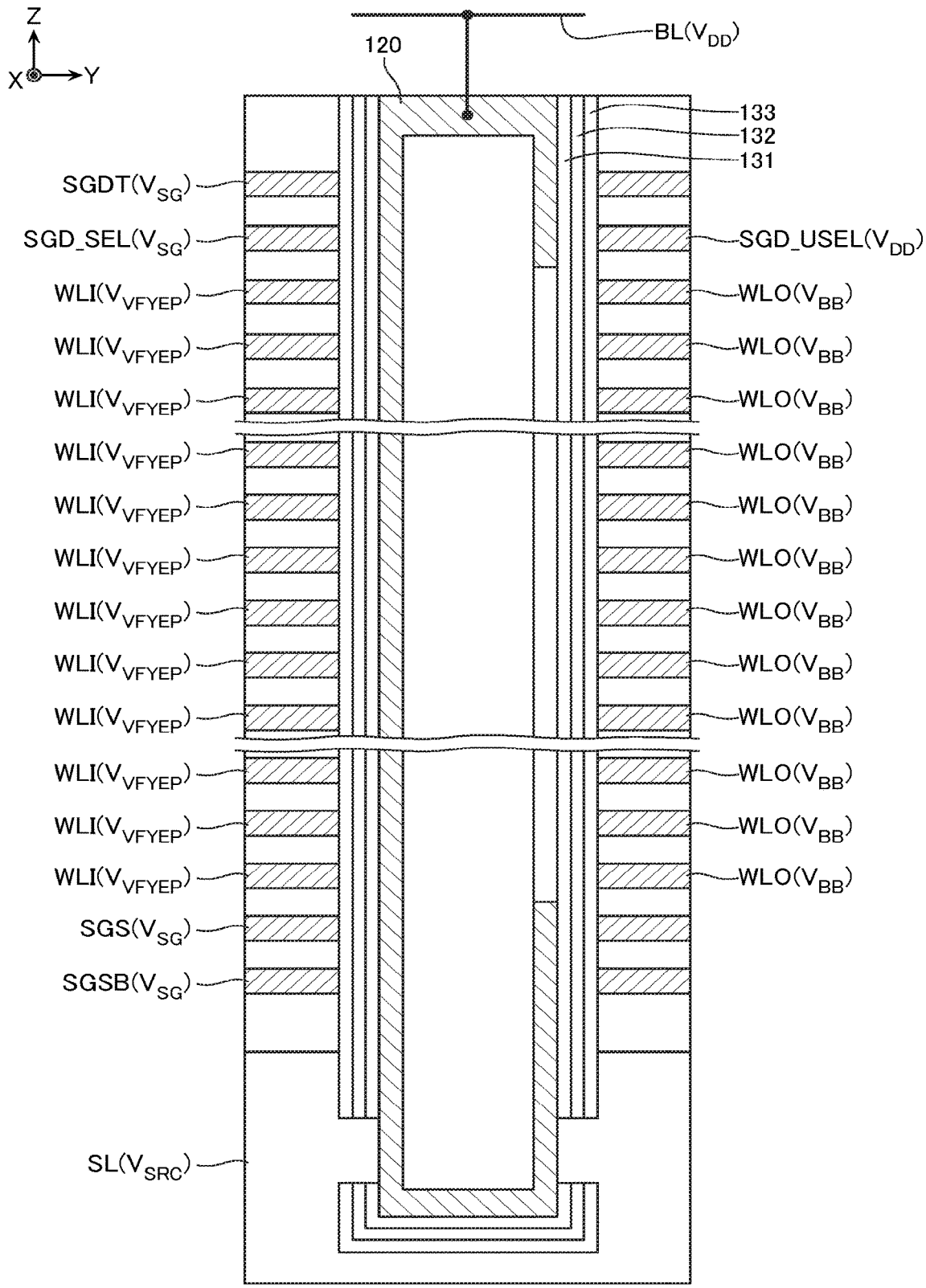
FIG. 38 is a schematic cross-sectional view for explaining a front-side EP verify operation according to a seventh embodiment.

FIG. 38 is a schematic cross-sectional view for explaining the front-side EP verify operation according to the seventh embodiment.

The front-side EP verify operation according to the seventh embodiment is basically executed similarly to the front-side EP verify operation described with reference to FIG. 26.

However, in the front-side EP verify operation according to the seventh embodiment, as shown in FIG. 38, all of the word lines WLI arranged in the Z direction are applied with the EP verify voltage $V_{VFYEP}$.

The reverse-side EP verify operation according to the seventh embodiment is basically executed similarly to the front-side EP verify operation.

However, the voltage applied to the word lines WLI in the front-side EP verify operation is applied to the word lines WLO in the reverse-side EP verify operation. Moreover, the voltage applied to the word lines WLO in the front-side EP verify operation is applied to the word lines WLI in the reverse-side EP verify operation.

Other Embodiments

Semiconductor memory devices according to first through seventh embodiments have been exemplified above. However, the configurations of the kind shown in the first through seventh embodiments are merely exemplifications, and specific configurations, and so on, of the semiconductor memory devices may be appropriately adjusted. Moreover, the operations of the kind shown in the first through seventh embodiments, too, are merely exemplifications, and magnitudes of voltages, timings of applying the voltages, and so on, may be appropriately adjusted.

Moreover, in the above examples, there have been described examples in which the upper end and lower end of the semiconductor layer 120 are connected to an N type semiconductor layer. However, at least one of the upper end and lower end of the semiconductor layer 120 may be connected to a P type semiconductor layer including an impurity such as boron (B). In this case, in the erase voltage supply operation, holes may be applied to the semiconductor layer 120, via the P type semiconductor layer, from at least one of the source line SL and bit line BL, rather than holes being applied to the semiconductor layer 120 by generating GIDL.

Moreover, the methods of controlling the semiconductor memory device according to the first through seventh embodiments may be executed at least either before shipment or after shipment. In the case of them being executed before shipment, the methods of controlling the semiconductor memory device according to the first through seventh embodiments may be executed at least either before dicing or after dicing. Now, in the case of the methods of controlling the semiconductor memory device according to the first through third embodiments being executed before dicing, the current comparing circuit of the kind described with reference to FIG. 4 may be provided in a calf region.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a semiconductor layer that extends in a first direction;
a first conductive layer and a second conductive layer that are arranged in a second direction intersecting the first direction, and that face the semiconductor layer from one side and the other side in the second direction;
a charge storage layer that comprises a first portion provided between the semiconductor layer and the first conductive layer and a second portion provided between the semiconductor layer and the second conductive layer;
a bit line electrically connected to the semiconductor layer; and
a source line electrically connected to the semiconductor layer,
the semiconductor memory device being configured to execute:
an erase operation in which an erase voltage is applied to at least one of the bit line and the source line, and a first voltage which is lower than the erase voltage is applied to the first conductive layer and the second conductive layer;
a first write operation in which a first program voltage which is higher than the first voltage is applied to the first conductive layer and the second conductive layer; and
a second write operation in which a second program voltage which is higher than the first voltage is applied to the first conductive layer, and a second voltage which is higher than the first voltage and lower than the second program voltage is applied to the second conductive layer,
the first write operation being executed after execution of the erase operation, and
the second write operation being executed after execution of the erase operation and before execution of the first write operation.

2. The semiconductor memory device according to claim 1, wherein
the second voltage is a write pass voltage.

3. The semiconductor memory device according to claim 2, comprising
a third conductive layer and a fourth conductive layer that are arranged in the second direction, and that face the semiconductor layer from one side and the other side in the second direction,
wherein the third conductive layer is arranged with the first conductive layer in the first direction,
the fourth conductive layer is arranged with the second conductive layer in the first direction, and
in the second write operation, the third conductive layer and the fourth conductive layer are applied with the write pass voltage.

4. The semiconductor memory device according to claim 2, comprising
a third conductive layer and a fourth conductive layer that are arranged in the second direction, and that face the semiconductor layer from one side and the other side in the second direction,
wherein the third conductive layer is arranged with the first conductive layer in the first direction,
the fourth conductive layer is arranged with the second conductive layer in the first direction, and
in the second write operation, the third conductive layer is applied with the second program voltage, and the fourth conductive layer is applied with the write pass voltage.

5. The semiconductor memory device according to claim 2, configured to execute
a third write operation in which the write pass voltage is applied to the first conductive layer, and a third program voltage which is higher than the write pass voltage is applied to the second conductive layer,
wherein the third write operation is executed after execution of the second write operation and before execution of the first write operation.

6. The semiconductor memory device according to claim 5, comprising
a third conductive layer and a fourth conductive layer that are arranged in the second direction, and that face the semiconductor layer from one side and the other side in the second direction,
wherein the third conductive layer is arranged with the first conductive layer in the first direction,
the fourth conductive layer is arranged with the second conductive layer in the first direction, and
in the third write operation, the third conductive layer and the fourth conductive layer are applied with the write pass voltage.

7. The semiconductor memory device according to claim 5, comprising
a third conductive layer and a fourth conductive layer that are arranged in the second direction, and that face the semiconductor layer from one side and the other side in the second direction,
wherein the third conductive layer is arranged with the first conductive layer in the first direction,
the fourth conductive layer is arranged with the second conductive layer in the first direction, and
in the third write operation, the third conductive layer is applied with the write pass voltage, and the fourth conductive layer is applied with the third program voltage.

8. The semiconductor memory device according to claim 2, configured to execute:
a first verify operation in which a first verify voltage which is lower than the write pass voltage is applied to the first conductive layer, and a third voltage which is lower than the first voltage is applied to the second conductive layer; and
a second verify operation in which the third voltage is applied to the first conductive layer, and the first verify voltage is applied to the second conductive layer,
wherein the first verify operation and the second verify operation are executed after execution of the erase operation and before execution of the second write operation.

9. The semiconductor memory device according to claim 8, comprising
a third conductive layer and a fourth conductive layer that are arranged in the second direction, and that face the semiconductor layer from one side and the other side in the second direction,
wherein the third conductive layer is arranged with the first conductive layer in the first direction, the fourth conductive layer is arranged with the second conductive layer in the first direction, in the first verify operation, the third conductive layer is applied with a read pass voltage which is larger than the first verify voltage, and in the second verify operation, the fourth conductive layer is applied with the read pass voltage.

10. The semiconductor memory device according to claim 8, comprising a third conductive layer and a fourth conductive layer that are arranged in the second direction, and that face the semiconductor layer from one side and the other side in the second direction, wherein the third conductive layer is arranged with the first conductive layer in the first direction, the fourth conductive layer is arranged with the second conductive layer in the first direction, in the first verify operation, the third conductive layer is applied with the first verify voltage, and in the second verify operation, the fourth conductive layer is applied with the first verify voltage.

11. The semiconductor memory device according to claim 8, comprising a first circuit which is electrically connected to the source line, wherein the first circuit comprises:

a first node and a second node that are electrically connected to the source line;

a first capacitor connected to the first node;

a second capacitor connected to the second node;

a first inverter comprising an output terminal connected to the first node and an input terminal connected to the second node; and a second inverter comprising an output terminal connected to the second node and an input terminal connected to the first node.

12. The semiconductor memory device according to claim 11, wherein the first circuit comprises:

a first switch transistor which is provided in a current path between the source line and the first node; and a second switch transistor which is provided in a current path between the source line and the second node, in the first verify operation, a gate electrode of the first switch transistor is applied with a voltage that sets the first switch transistor to an ON state, and a gate electrode of the second switch transistor is applied with a voltage that sets the second switch transistor to an OFF state, and in the second verify operation, the gate electrode of the first switch transistor is applied with a voltage that sets the first switch transistor to an OFF state, and the gate electrode of the second switch transistor is applied with a voltage that sets the second switch transistor to an ON state.

13. The semiconductor memory device according to claim 1, configured so that magnitude of the second program voltage is adjustable.

14. The semiconductor memory device according to claim 12, configured so that magnitude of the second program voltage is adjustable according to magnitude of voltage of the first node or the second node after execution of the first verify operation and the second verify operation.

15. The semiconductor memory device according to claim 8, wherein a plurality of the second write operations and a plurality of the first verify operations are repeatedly executed after execution of the erase operation and before execution of the first write operation.

16. A semiconductor memory device comprising:

a semiconductor layer that extends in a first direction;

a first conductive layer and a second conductive layer that are arranged in a second direction intersecting the first direction, and that face the semiconductor layer from one side and the other side in the second direction;

a charge storage layer that comprises a first portion provided between the semiconductor layer and the first conductive layer and a second portion provided between the semiconductor layer and the second conductive layer;

a bit line electrically connected to the semiconductor layer;

a source line electrically connected to the semiconductor layer; and a first circuit electrically connected to the source line, the first circuit comprising:

a first node and a second node that are electrically connected to the source line;

a first capacitor connected to the first node;

a second capacitor connected to the second node;

a first inverter comprising an output terminal connected to the first node and an input terminal connected to the second node; and a second inverter comprising an output terminal connected to the second node and an input terminal connected to the first node.

17. A method of controlling a semiconductor memory device, the semiconductor memory device comprising:

a semiconductor layer that extends in a first direction;

a first conductive layer and a second conductive layer that are arranged in a second direction intersecting the first direction, and that face the semiconductor layer from one side and the other side in the second direction;

a charge storage layer that comprises a first portion provided between the semiconductor layer and the first conductive layer and a second portion provided between the semiconductor layer and the second conductive layer;

a bit line electrically connected to the semiconductor layer; and a source line electrically connected to the semiconductor layer, and the semiconductor memory device being configured to execute:

an erase operation in which an erase voltage is applied to at least one of the bit line and the source line, and a first voltage which is lower than the erase voltage is applied to the first conductive layer and the second conductive layer;

a first write operation in which a first program voltage which is higher than the first voltage is applied to the first conductive layer and the second conductive layer; and a second write operation in which a second program voltage which is higher than the first voltage is applied to the first conductive layer, and a second voltage which is higher than the first voltage and lower than the second program voltage is applied to the second conductive layer, in the method, the first write operation being executed after execution of the erase operation, and the second write operation being executed after execution of the erase operation and before execution of the first write operation.

18. The method of controlling the semiconductor memory device according to claim 17, wherein the second voltage is a write pass voltage.

19. The method of controlling the semiconductor memory device according to claim 18, wherein the semiconductor memory device is configured to execute a third write operation in which the write pass voltage is applied to the first conductive layer, and a third program voltage which is higher than the write pass voltage is applied to the second conductive layer, and the third write operation is executed after execution of the second write operation and before execution of the first write operation.

20. The method of controlling the semiconductor memory device according to claim 18, wherein the semiconductor memory device is configured to execute:

a first verify operation in which a first verify voltage which is lower than the write pass voltage is applied to the first conductive layer, and a third voltage which is lower than the first voltage is applied to the second conductive layer; and a second verify operation in which the third voltage is applied to the first conductive layer, and the first verify voltage is applied to the second conductive layer, and the first verify operation and the second verify operation are executed after execution of the erase operation and before execution of the second write operation.

21. The method of controlling the semiconductor memory device according to claim 20, wherein magnitude of the second program voltage is adjusted according to a result of the first verify operation and the second verify operation.

22. The method of controlling the semiconductor memory device according to claim 20, wherein a plurality of the second write operations and a plurality of the first verify operations are repeatedly executed after execution of the erase operation and before execution of the first write operation.

* * * * *